(12) United States Patent
Itai

(10) Patent No.: US 7,994,579 B2
(45) Date of Patent: Aug. 9, 2011

(54) THIN FILM FIELD-EFFECT TRANSISTOR AND DISPLAY USING THE SAME

(75) Inventor: Yuichiro Itai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 204 days.

(21) Appl. No.: 12/545,885

(22) Filed: Aug. 24, 2009

(65) Prior Publication Data
US 2010/0059746 A1 Mar. 11, 2010

(30) Foreign Application Priority Data

Sep. 9, 2008 (JP) ................................. 2008-231101

(51) Int. Cl.
H01L 29/12 (2006.01)
(52) U.S. Cl. ........................... 257/359; 257/43; 438/104
(58) Field of Classification Search .................... 257/43, 257/359; 438/104
See application file for complete search history.

(56) References Cited

U.S. PATENT DOCUMENTS

| 2006/0038242 | A1 | 2/2006 | Hsu et al. |
| 2006/0244107 | A1 | 11/2006 | Sugihara et al. |
| 2008/0191204 | A1 | 8/2008 | Kim et al. |
| 2010/0038641 | A1* | 2/2010 | Imai .................................. 257/57 |
| 2010/0163863 | A1* | 7/2010 | Yaegashi ........................... 257/43 |

FOREIGN PATENT DOCUMENTS

| JP | 2006-165529 A | 6/2006 |
| JP | 2008-53356 A | 3/2008 |
| JP | 2008-166716 A | 7/2008 |

OTHER PUBLICATIONS

Corresponding EPO Official communication, Dec. 10, 2009.
IDW/AD' 05, pp. 845-846 (Dec. 6, 2005).
Nature, vol. 432, pp. 488-492 (Nov. 25, 2004).

* cited by examiner

Primary Examiner — Fernando L Toledo
(74) Attorney, Agent, or Firm — Solaris Intellectual Property Group, PLLC

(57) ABSTRACT

The present invention provides a thin film field-effect transistor comprising a substrate having thereon at least a gate electrode, a gate insulating film, an active layer, a source electrode, and a drain electrode, wherein the active layer is an oxide semiconductor layer, a resistance layer having an electric conductivity that is lower than an electric conductivity of the active layer is provided between the active layer and at least one of the source electrode or the drain electrode, and an intermediate layer comprising an oxide comprising an element having a stronger bonding force with respect to oxygen than that of the oxide semiconductor in the active layer is provided between the active layer and the resistance layer.

14 Claims, 6 Drawing Sheets

LIFT-OFF METHOD

ACTIVE LAYER FORMATION

RESIST FILM FORMATION

SOURCE-DRAIN ELECTRODE FILM FORMATION

RESIST DISSOLUTION AND REMOVAL

ETCHING METHOD

ACTIVE LAYER FORMATION

SOURCE-DRAIN ELECTRODE FILM FORMATION

RESIST FILM FORMATION

ETCHING

RESIST DISSOLUTION AND REMOVAL

ETCHING METHOD (2)
GATE INSULATING FILM

SUBSTRATE    GATE ELECTRODE

⇩

ACTIVE LAYER FORMATION
ACTIVE LAYER

⇩

INTERMEDIATE LAYER FORMATION
INTERMEDIATE LAYER

⇩

SOURCE-DRAIN ELECTRODE FILM FORMATION
SOURCE-DRAIN ELECTRODE FILM

⇩

RESIST FILM FORMATION
RESIST    RESIST

⇩

ETCHING

ETCHING

⇩

RESIST DISSOLUTION AND REMOVAL
SOURCE ELECTRODE    DRAIN ELECTRODE

THIN FILM FIELD-EFFECT TRANSISTOR AND DISPLAY USING THE SAME

CROSS-REFERENCE TO RELATED APPLICATION

This application claims priority under 35 USC 119 from Japanese Patent Application No. 2008-231101 filed on Sep. 9, 2008, the disclosure of which is incorporated by reference herein.

BACKGROUND

1. Field of the Invention

The present invention relates to a thin film field-effect transistor and a display using the same. Specifically, the invention relates to a thin film field-effect transistor using an amorphous oxide semiconductor in an active layer and a display using the same.

2. Related Art

In recent years, due to progress in liquid crystal and electroluminescence (EL) technologies and the like, flat panel displays (FPD) have been put to practical use. In particular, since high intensity light emission can be obtained by low voltage with an organic electroluminescent device (hereinafter sometimes also referred to as "an organic EL device") using a thin film material that is excited and emits light by applying an electric current, effects such as reduction in device thickness, weight and size, energy saving and the like are expected in broad fields including portable telephone displays, personal digital assistants (PDA), computer displays, information displays of automobiles, TV monitors, and general illumination.

These FPDs are driven by an active matrix circuit of a field-effect thin film transistor (hereinafter sometimes referred to as a thin film transistor or TFT) using an amorphous silicon thin film or a polycrystalline silicon thin film in an active layer provided on a glass substrate.

On the other hand, attempts have also been made to use a light weight and flexible resin substrate in place of a glass substrate in order to achieve further reduction in thickness, reduction in weight, and improvement in breaking resistance of these FPDs.

However, manufacture of the above transistors using silicon thin films requires a thermal process of relatively high temperature, and it is generally difficult to directly form a thin film on a resin substrate that is low in heat resistance.

Accordingly, a TFT using an amorphous oxide capable of film-forming at a low temperature, e.g., In—Ga—Zn—O series amorphous oxides, as a semiconductor thin film has been actively developed (e.g., refer to Japanese Patent Application Laid-Open (JP-A) No. 2006-165529), and IDW/AD '05, pp. 845-846 (Dec. 6, 2005)).

A TFT using an amorphous oxide semiconductor is capable of film-forming at room temperature and can be formed on a film, and therefore it has recently been attracting attention as the material of an active layer of a film (flexible) TFT. In particular, it has been reported by Hosono et al. of the Tokyo Institute of Technology that a TFT using a-IGZO has a field-effect mobility of about 10 $cm^2$/Vs even on a PEN substrate, which is higher than that of an a-Si series TFT on a glass substrate (e.g., refer to NATURE, Vol. 432, pp. 488-492 (Nov. 25, 2004)), and such a TFT has been receiving attention in particular as a film TFT.

However, an amorphous oxide semiconductor layer is liable to cause oxygen defects, and has problems such that the layer fluctuates according to the atmosphere at the time of film forming, semiconductor characteristics are variable due to plasma irradiation and the like at the time of film forming, or performances fluctuate during storage after manufacture. Further, there is a problem such that an amorphous oxide semiconductor layer is liable to be corroded by an acidic etchant for patterning, and a patterning process by photolithography cannot be used, so that highly refined patterning is difficult.

As a method for solving these problems, it is reported that oxygen defects can be suppressed by, for example, providing an amorphous oxide insulating layer as a protective layer, exactly controlling the oxygen concentration in a deposition process, and controlling to include $3.8 \times 10^{19}$ pieces/$cm^3$ or more of desorbed gas observed as oxygen by thermal desorption spectroscopy (e.g., refer to JP-A No. 2008-166716). It is also reported that oxygen defects can be suppressed by including a first process of forming a semiconductor layer in an atmosphere having an introduced oxygen partial pressure of $1 \times 10^{-3}$ Pa or less, and a second process of performing heat treatment (at 150° C. to 450° C.) in an oxidizing atmosphere after the first process to restore the oxygen defects that have occurred in the semiconductor layer-forming process by the second process (e.g., refer to JP-A No. 2008-53356). However, since both methods require exact control of process conditions in the control of oxygen defects, the processes are complicated, the apparatus are large-sized, and strong heat treatment cannot be applied to a TFT using a film (flexible) substrate. Further, the problems of etchant-resistance in a patterning process and storage stability of a semiconductor film after manufacture remain unresolved.

SUMMARY

The present invention has been made in view of the above circumstances and provides a thin film field-effect transistor and a display using the same.

A first aspect of the invention provides a thin film field-effect transistor comprising a substrate having thereon at least a gate electrode, a gate insulating film, an active layer, a source electrode, and a drain electrode, wherein the active layer is an oxide semiconductor layer, a resistance layer having an electric conductivity that is lower than an electric conductivity of the active layer is provided between the active layer and at least one of the source electrode or the drain electrode, and an intermediate layer comprising an oxide comprising an element having a stronger bonding force with respect to oxygen than that of the oxide semiconductor in the active layer is provided between the active layer and the resistance layer.

BRIEF DESCRIPTION OF THE DRAWINGS

Exemplary embodiments of the present invention will be described in detail based on the following figures, wherein.

DETAILED DESCRIPTION OF THE INVENTION

Figure 1:
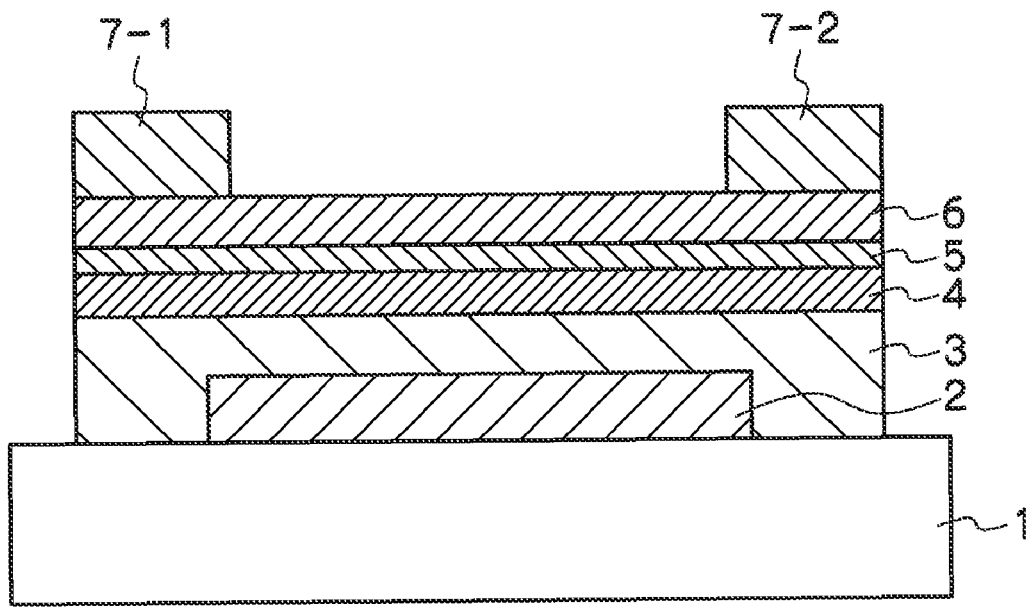
FIG. 1 is a pattern diagram showing an embodiment of the structure of TFT device in the invention.

A TFT using an amorphous oxide semiconductor is capable of film forming at room temperature, and it can be formed with a flexible plastic film as a substrate, therefore, it is attracting public attention as the material of an active layer of film (flexible) TFT. TFT having performances of field-effect mobility of 10 $cm^2/Vs$ and ON/OFF ratio exceeding $10^3$ by using In—Ga—Zn—O series oxide as a semiconductor layer (an active layer) formed on PET is disclosed in JP-A No. 2006-165529. However, in a case of using such a TFT in, e.g., a driving circuit of a display, performance is still insufficient to actuate the driving circuit in view of the mobility and ON/OFF ratio.

In prior art, it has been necessary to make electron carrier concentration in an active layer less than $10^{18}/cm^3$ to reduce OFF current. The reason for this fact is that since the electron mobility of an amorphous oxide semiconductor for use in an active layer is liable to lower with the lowering of electron carrier concentration, it has been difficult to form TFT capable of reconciling good OFF characteristic and high mobility.

Further, it has been required to obtain TFT having stable performance by controlling the fluctuation of TFT performance ascribable to oxygen defect, having sufficient etchant-resistance, and capable of highly excise patterning by photolithography and etching.

The present inventors have earnestly studied for searching the TFT capable of heightening field-effect mobility and improving ON/OFF ratio. As a result, it has been found that the problems can be solved by a thin film field-effect transistor comprising a substrate having thereon at least a gate electrode, a gate insulating film, an active layer, a source electrode, and a drain electrode, wherein the active layer is an oxide semiconductor layer, a resistance layer lower in electric conductivity than that of the active layer is provided between the active layer and at least one of the source electrode and the drain electrode, and an intermediate layer containing an oxide containing element species stronger in the bonding force to oxygen than the oxide semiconductor in the active layer is provided between the active layer and the resistance layer. Thus, the invention has been achieved.

1. Thin Film Field-Effect Transistor

A thin film field-effect transistor is an active device having at least a gate electrode, a gate insulating film, an active layer, a source electrode, and a drain electrode in order, and having functions of applying voltage to the gate electrode, controlling the current flowing to the active layer, and switching the current between the source electrode and the drain electrode. As a TFT structure, either a stagger structure or a reverse stagger structure can be formed.

The thin film field-effect transistor of the invention is a thin film field-effect transistor including a substrate having thereon at least a gate electrode, a gate insulating film, an active layer, a source electrode, and a drain electrode, wherein the active layer is an oxide semiconductor layer, a resistance layer having an electric conductivity that is lower than an electric conductivity of the active layer is provided between the active layer and at least one of the source electrode or the drain electrode, and an intermediate layer including an oxide including an element having a stronger bonding force with respect to oxygen than that of the oxide semiconductor in the active layer is provided between the active layer and the resistance layer.

Preferably, the intermediate layer further contains the oxide semiconductor.

The oxide containing element species strong in bonding force to oxygen contained in the intermediate layer is preferably an oxide containing at least one element selected from the group consisting of Ba, Ca, Ti, Fe, Ga, Mg, Al, Ge and Si.

The electric conductivity of the active layer is preferably $10^{-4}$ $Scm^{-1}$ or more and less than $10^2$ $Scm^{-1}$, and the ratio of the electric conductivity of the active layer to the electric conductivity of the resistance layer (electric conductivity of active layer/electric conductivity of resistance layer) is from $10^1$ to $10^{10}$.

The electric conductivity of the active layer is more preferably $10^{-1}$ $Scm^{-1}$ or more and less than $10^2$ $Scm^{-1}$.

The ratio of the electric conductivity of the active layer to the electric conductivity of the resistance layer (electric conductivity of active layer/electric conductivity of resistance layer) is more preferably from $10^2$ to $10^{10}$, and still more preferably from $10^2$ to $10^8$.

The oxide of the active layer is preferably an amorphous oxide.

The resistance layer preferably comprises an oxide semiconductor. The oxide semiconductor of the resistance layer is more preferably an amorphous oxide.

The oxide of the intermediate layer is preferably an amorphous oxide.

If the electric conductivity of the active layer is lower than $10^{-4}$ Scm$^{-1}$, high field-effect mobility cannot be obtained, while when it is higher than $10^{2}$ Scm$^{-1}$, OFF current increases and thus good ON/OFF ratio cannot be obtained, which is not preferred.

When the ratio of the electric conductivity of the active layer to the electric conductivity of the resistance layer (electric conductivity of active layer/electric conductivity of resistance layer) is lower than $10^{1}$, ON/OFF ratio becomes smaller and so not preferred, while if it exceeds $10^{10}$, durability is lowered, which is not preferred.

The thickness of the active layer is preferably thicker than the thickness of the resistance layer from the viewpoint of operation stability. The active layer is a part where current flows in the direction of the source-drain electrodes, and therefore, if the thickness is not sufficient, there is a possibility that degradation of durability and lowering of the yield rate occur. Accordingly, it is preferred for the active layer to be thicker than the resistance layer.

More preferably, the ratio of the thickness of the active layer to the thickness of the resistance layer (thickness of active layer/thickness of resistance layer) is greater than 1 and 100 or smaller, and still more preferably greater than 1 and 10 or smaller.

Further, as another embodiment, it is also preferred that the electric conductivity between the resistance layer and the active layer continuously changes.

Preferably, the oxide semiconductors of the active layer and the resistance layer contain at least one selected from the group consisting of In, Ga and Zn, or composite oxide thereof. More preferably the oxide semiconductors contain In and Zn, and the composition ratio of Zn and In in the resistance layer (the ratio of Zn to In, expressed by Zn/In) is greater than Zn/In ratio of the active layer. Preferably Zn/In ratio of the resistance layer is greater than Zn/In ratio of the active layer by 3% or more, more preferably greater by 10% or more.

The substrate is preferably a flexible resin substrate.

1) Structure

In the next place, the structure of the thin film field-effect transistor of the invention will be explained in detail with reference to drawings.

FIG. 1 shows a view of the thin film field-effect transistor of the invention, which is a pattern diagram showing an example of a reverse stagger structure. When substrate 1 is a flexible substrate such as a plastic film, insulating layer (not shown) is arranged on one surface of substrate 1, and gate electrode 2, gate insulating film 3, active layer 4, intermediate layer 5, and resistance layer 6 are laminated, on the surface of which are provided source electrode 7-1 and drain electrode 7-2.

In the foregoing constitution, resistance layer 6 is formed on intermediate layer 5 after intermediate layer 5 has been formed. Accordingly, active layer 4 is not directly exposed to plasma irradiation in the film-forming process of the resistance layer or the gas components at that time. The constitutional material of intermediate layer 5 is an oxide containing an element having a stronger bonding force with respect to oxygen than that of the oxide semiconductor in active layer 4, the material is stable against oxidation, invasion of oxygen atoms into the film, deoxidation and the like, and it has the functions of suppressing the variation in oxygen defects of the active layer due to conditions at the time of forming the resistance layer and the changing of semiconductor characteristics thereby. These suppression effects are also exerted with respect to the subsequent film-forming processes of the source electrode and the drain electrode so as to stably maintain the semiconductor characteristics of the active layer.

Active layer 4 is contiguous to gate insulating film 3 and resistance layer 6 is in contact with source electrode 7-1 and drain electrode 7-2. The compositions of active layer 4 and resistance layer 6 are determined so that the electric conductivity of active layer 4 is greater than that of resistance layer 6 in the state of voltage not being applied to the gate electrode. Here, the oxide semiconductors as disclosed in JP-A No. 2006-165529, e.g., In—Ga—Zn—O series oxide semiconductors are used in the active layer. It is known that the higher the electron carrier concentration, the higher is the electron mobility. That is, the higher the electric conductivity, the higher is the electron mobility.

According to the structure of the thin film field-effect transistor of the invention, in the state of ON of voltage being applied to the gate electrode, active layer 4 that serves as a channel has great electric conductivity, the field-effect mobility of the transistor is high, as a result high ON current can be obtained. The electric conductivity of resistance layer 6 is small in the state of OFF and highly resistive, so that OFF current is maintained low, therefore, ON/OFF ratio characteristic is conspicuously improved.

In conventional structure not having a resistance layer, it has been necessary to lower carrier concentration of an active layer in order to reduce OFF current. For the purpose of obtaining good ON/OFF ratio, JP-A No. 2006-165529 discloses to make electron carrier concentration less than $10^{18}/$cm$^{3}$, and more preferably less than $10^{16}/$cm$^{3}$, to reduce the electric conductivity of amorphous oxide semiconductor of the active layer. However, as shown in FIG. 2 in JP-A No. 2006-165529, with In—Ga—Zn—O series oxide semiconductor, when electron carrier concentration is lowered, the electron mobility of the film decreases.

Therefore, field-effect mobility of TFT of 10 cm$^{2}$/Vs or higher cannot be obtained, so that sufficient ON current cannot be obtained, and sufficient ON/OFF ratio characteristic cannot be obtained.

Further, when the electron carrier concentration of oxide semiconductor of active layer is increased for raising electron mobility of the film, electric conductivity of the active layer increases, OFF current rises, and ON/OFF ratio characteristic worsens.

Figure 2:
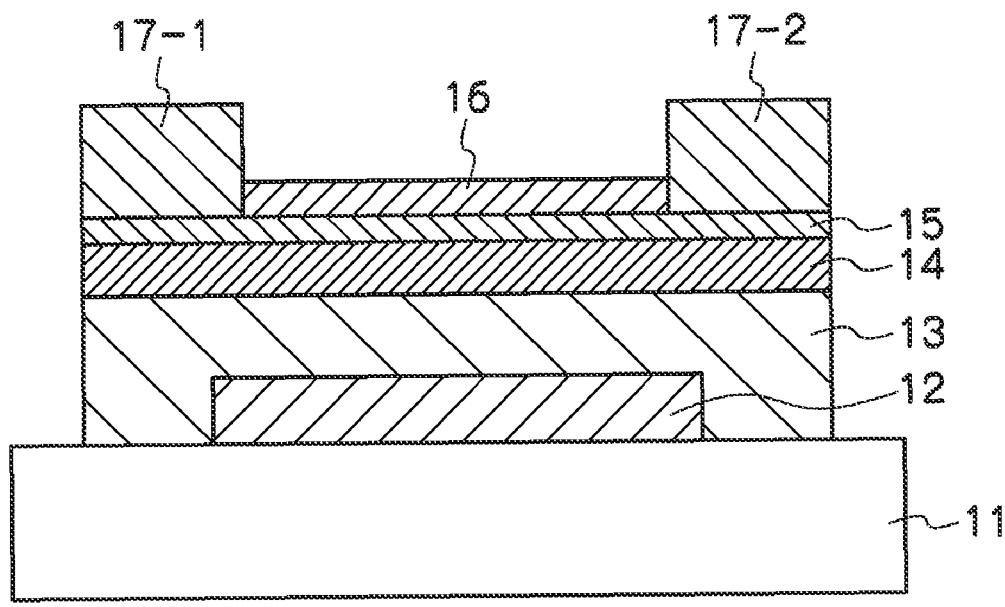
FIG. 2 is a pattern diagram showing another embodiment of the structure of TFT device of the invention.

FIG. 2 is a pattern diagram showing another embodiment of the structure of the thin film field-effect transistor of the invention. Active layer 14 and intermediate layer 15 are formed on gate insulating film 13, source electrode 17-1 and drain electrode 17-2 are provided by patterning, and resistance layer 16 is arranged in the area between source electrode 17-1 and drain electrode 17-2 forming a channel. Note that, symbol 11 in FIG. 2 represents substrate and symbol 12 represents gate electrode.

In this structure, the source electrode and the drain electrode are formed on intermediate layer 15 after intermediate layer 15 has been formed. Accordingly, active layer 14 is not directly exposed to plasma irradiation in the film-forming processes of the source electrode and the drain electrode or the gas components at those times. The constitutional material of intermediate layer 15 is an oxide containing an element having a stronger bonding force with respect to oxygen than that of the oxide semiconductor in active layer 14, the material is stable against oxidation, invasion of oxygen atoms into the film, deoxidation and the like, and it has the functions of suppressing the variation in oxygen defects of the active layer due to process conditions after active layer formation and the changing of semiconductor characteristics thereby. These suppression effects are also exerted with respect to the subsequent film-forming processes of the source electrode and the drain electrode so as to stably maintain the semiconductor characteristics of the active layer.

Further, intermediate layer 15 carries out the function of a barrier layer to the etchant by a photolithography method and has the effect to prevent the active layer from being corroded by the etchant. Accordingly, patterning of the source electrode and the drain electrode can be done by a photolithography method and highly refined patterning is possible.

In the constitution of FIG. 2, when voltage is applied to the gate electrode 12 to form a channel and the state of ON, since active layer 14 that serves as a channel has great electric conductivity, the field-effect mobility of the transistor becomes high, as a result high ON current can be obtained. In the OFF state in which voltage is not applied to the gate electrode and a channel is not formed, OFF current is maintained low by the intervention of resistance layer 16 having great electric resistance between source electrode 17-1, drain electrode 17-2 and active layer 14, therefore, ON/OFF ratio characteristic is conspicuously improved.

Figure 3:
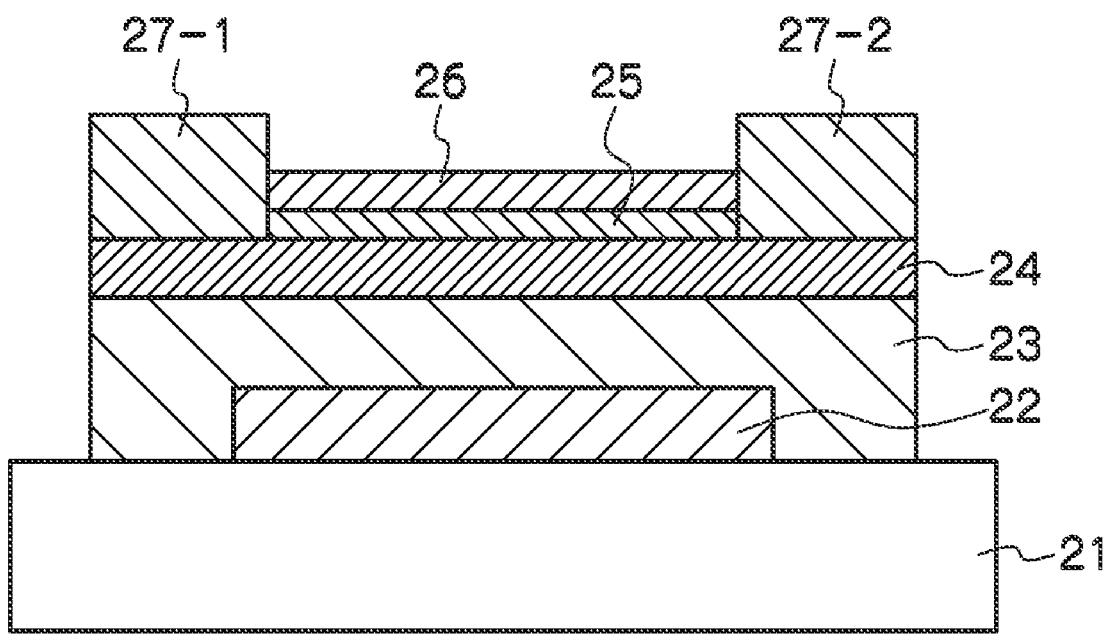
FIG. 3 is a pattern diagram showing another embodiment of the structure of TFT device of the invention.
Figure 4A:
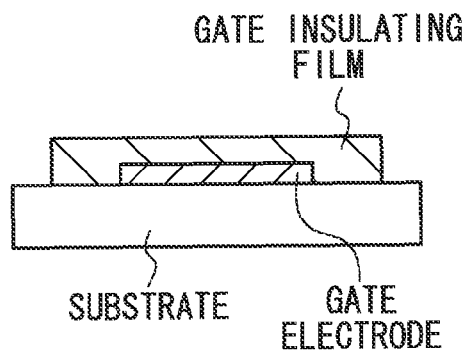
FIG. 4A is a pattern diagram showing a patterning process of source/drain electrodes by a lift-off method.
Figure 4B:
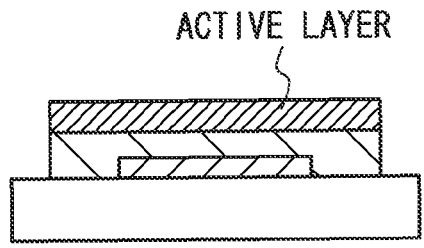
FIG. 4B is a pattern diagram showing a patterning process of source/drain electrodes by a lift-off method.
Figure 4C:
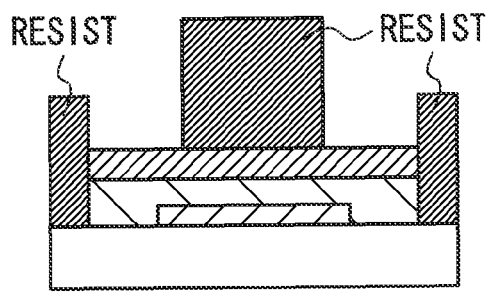
FIG. 4C is a pattern diagram showing a patterning process of source/drain electrodes by a lift-off method.
Figure 4C:
Figure 4D:
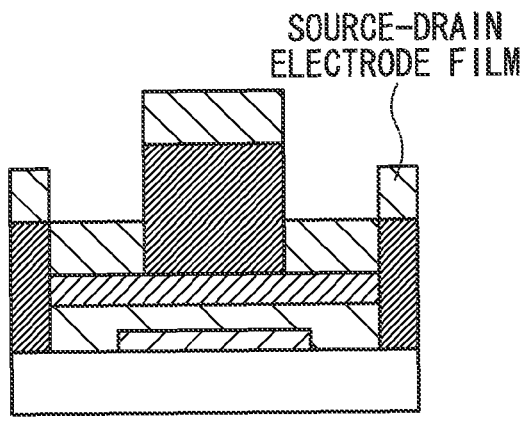
FIG. 4D is a pattern diagram showing a patterning process of source/drain electrodes by a lift-off method.
Figure 4D:
Figure 4E:
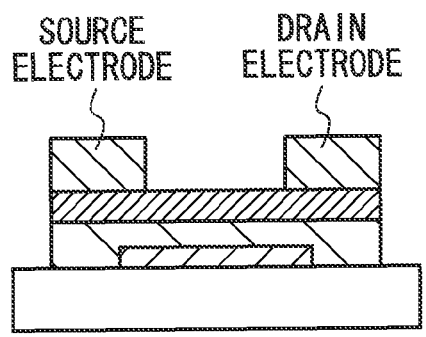
FIG. 4E is a pattern diagram showing a patterning process of source/drain electrodes by a lift-off method.
Figure 5A:
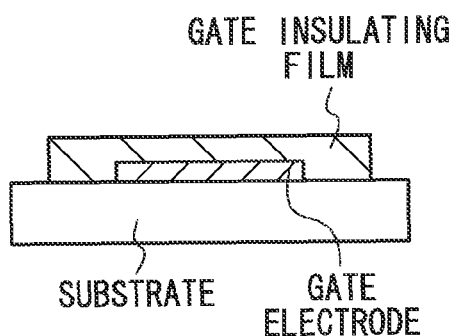
FIG. 5A is a pattern diagram showing a patterning process of source/drain electrodes by an etching method.
Figure 5B:
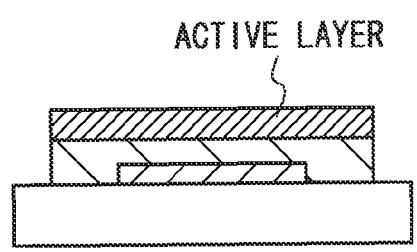
FIG. 5B is a pattern diagram showing a patterning process of source/drain electrodes by an etching method.
Figure 5C:
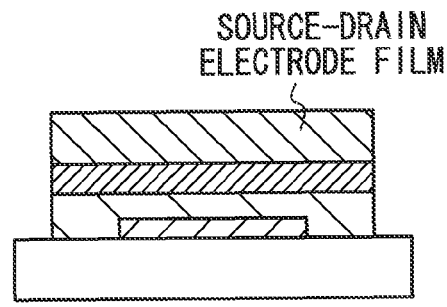
FIG. 5C is a pattern diagram showing a patterning process of source/drain electrodes by an etching method.
Figure 5D:
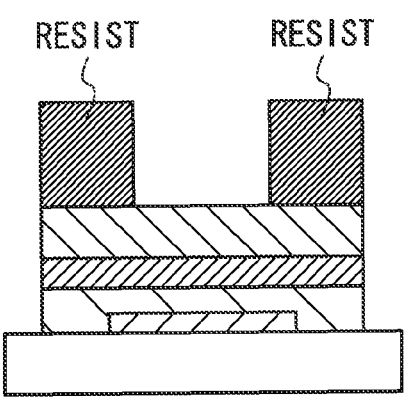
FIG. 5D is a pattern diagram showing a patterning process of source/drain electrodes by an etching method.
Figure 5E:
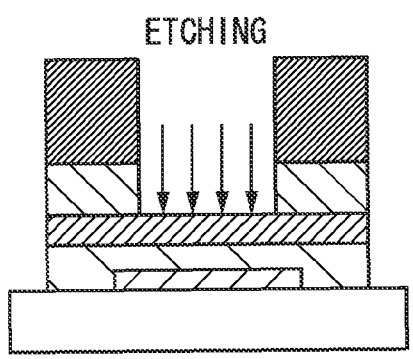
FIG. 5E is a pattern diagram showing a patterning process of source/drain electrodes by an etching method.
Figure 5F:
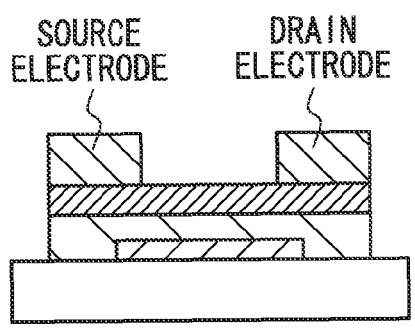
FIG. 5F is a pattern diagram showing a patterning process of source/drain electrodes by an etching method.
Figure 6A:
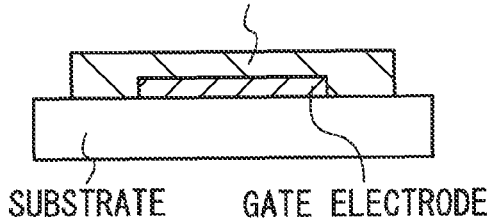
FIG. 6A is a pattern diagram showing a patterning process of source/drain electrodes by an etching method in the TFT device in the invention.
Figure 6B:
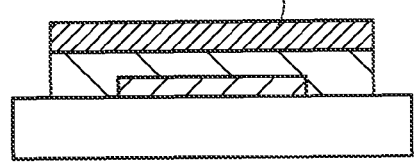
FIG. 6B is a pattern diagram showing a patterning process of source/drain electrodes by an etching method in the TFT device in the invention.
Figure 6C:
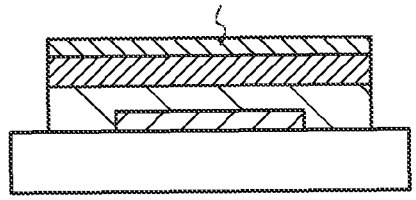
FIG. 6C is a pattern diagram showing a patterning process of source/drain electrodes by an etching method in the TFT device in the invention.
Figure 6D:
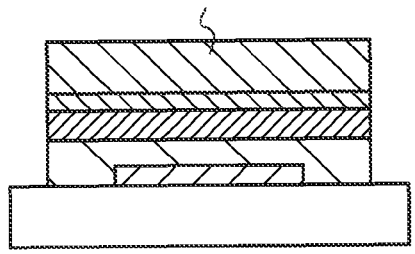
FIG. 6D is a pattern diagram showing a patterning process of source/drain electrodes by an etching method in the TFT device in the invention.
Figure 6E:
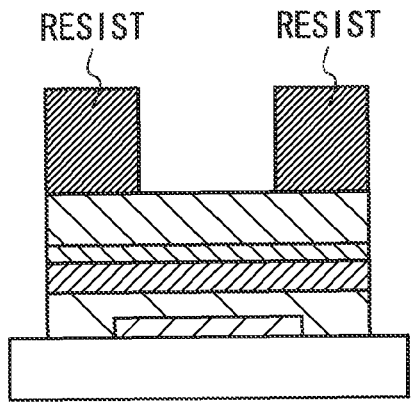
FIG. 6E is a pattern diagram showing a patterning process of source/drain electrodes by an etching method in the TFT device in the invention.
Figure 6F:
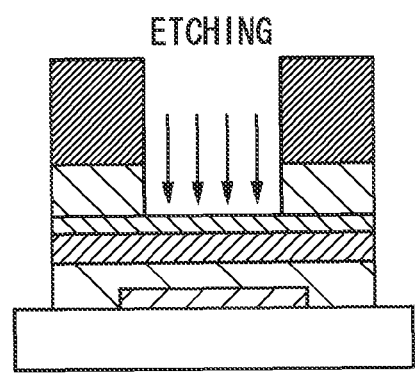
FIG. 6F is a pattern diagram showing a patterning process of source/drain electrodes by an etching method in the TFT device in the invention.
Figure 6G:
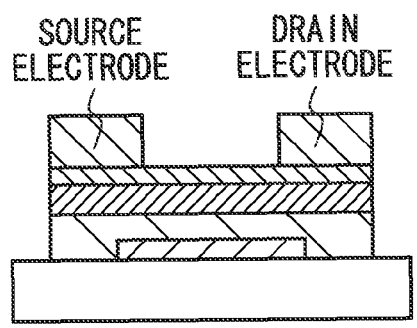
FIG. 6G is a pattern diagram showing a patterning process of source/drain electrodes by an etching method in the TFT device in the invention.

FIG. 3 is a pattern diagram of another structure of the thin film field-effect transistor of the invention showing an example of a reverse stagger structure. Active layer 24 is formed on gate insulating film 23, source electrode 27-1 and drain electrode 27-2 are provided by patterning, and intermediate layer 25 and resistance layer 26 are arranged in the area between source electrode 27-1 and drain electrode 27-2 forming a channel. Note that, the symbol 21 of FIG. 3 represents substrate.

In this constitution, resistance layer 26 is formed on intermediate layer 25 after intermediate layer 25 has been formed. Accordingly, active layer 24 is not directly exposed to plasma irradiation in the film-forming processes of resistance layer 26 or the gas component at that time. The constitutional material of intermediate layer 25 is an oxide containing an element having a stronger bonding force with respect to oxygen than that of the oxide semiconductor in active layer 24, the material is stable against oxidation, invasion of oxygen atoms into the film, deoxidation and the like, and it has the functions of suppressing the variation in oxygen defects of the active layer due to conditions at the time of resistance layer formation and the changing of semiconductor characteristics thereby.

When voltage is applied to the gate electrode to form a channel and the state of ON, since active layer 24 that serves as a channel has great electric conductivity, the field-effect mobility of the transistor becomes high, as a result high ON current can be obtained. In the OFF state in which voltage is not applied to the gate electrode and a channel is not formed, OFF current is maintained low by the intervention of resistance layer 26 having great electric resistance between source electrode 27-1 and drain electrode 27-2, therefore, ON/OFF ratio characteristic is conspicuously improved.

2) Electric Conductivity

The electric conductivity of the oxide semiconductors of the active layer and the resistance layer in the invention will be explained below.

Electric conductivity is a value of physical characteristic showing the easiness of electric conductivity of a material, and electric conductivity σ of a material is represented by the following expression with the carrier concentration of the material being n, elementary quantity of charge being e, and carrier mobility μ:

$$\sigma = ne\mu$$

When an oxide semiconductor is an n-type semiconductor, the carrier is an electron, and carrier concentration means electron carrier concentration, and carrier mobility means electron mobility. Similarly, when an oxide semiconductor is a p-type semiconductor, the carrier is a hole, and carrier concentration means hole carrier concentration, and carrier mobility means hole mobility. Incidentally, the carrier concentration and the carrier mobility of a material can be found by measurement of holes.

<Finding Method of Electric Conductivity>

Electric conductivity of a film can be found by measuring the sheet resistance of a film whose thickness is known. The electric conductivity of semiconductor fluctuates according to temperature. The electric conductivity in the invention shows electric conductivity at room temperature (20° C.).

3) Gate Insulating Film

As the gate insulating film, insulators such as $SiO_2$, $SiN_x$, SiON, $Al_2O_3$, $Y_2O_3$, $Ta_2O_5$, $HfO_2$ and the like, or liquid crystal compounds containing at least two or more of these compounds are used. Further, polymer insulators such as polyimide can also be used as the gate insulating film.

The thickness of the gate insulating film is preferably 10 nm to 1,000 nm. The thickness of the gate insulating film is necessary to be thick to some degree for reducing leaking current and increasing voltage resistance. However, the increase of the thickness of a gate insulating film results in the increment of the driving voltage of TFT. The thickness is preferably 100 nm to 200 nm.

When the gate insulating film is a polymer insulator, the thickness is more preferably 0.5 μm to 5 μm. In particular, when an insulator having a high dielectric constant such as $HfO_2$ is used as a gate insulating film, driving of TFT at low voltage is possible even when the thickness is thickened and so especially preferred.

4) Active Layer, Resistance Layer

It is preferred to use oxide semiconductors in the active layer and resistance layer for use in the invention, and amorphous oxide semiconductors are more preferred. Since oxide semiconductors, in particular amorphous oxide semiconductors, are capable of film-forming at a low temperature, they can be formed on a resin substrate having flexibility such as plastics. Amorphous oxide semiconductors capable of forming at a low temperature are, e.g., oxides containing In, oxides containing In and Zn, and oxides containing In, Ga and Zn as disclosed in JP-A No. 2006-165529, and as composition structure, it is known that those containing $InGaO_3(ZnO)_m$ (m is a natural number of less than 6) are preferred. These are n-type semiconductors whose carriers are electrons. p-Type oxide semiconductors such as ZnO; $Rh_2O_3$, $CuGaO_2$, and $SrCu_2O_2$ may of course be used in the active layer and resistance layer.

Specifically, amorphous oxide semiconductors for use in the invention comprises In—Ga—Zn—O, and amorphous oxide semiconductors having the composition of $InGaO_3(ZnO)_m$ (m is a natural number of less than 6) in a crystal state are preferred. $InGaZnO_4$ is more preferred. As the characteristic of amorphous oxide semiconductors of this composition, electron mobility is liable to rise with the increase of electric conductivity. Conductivity can be controlled by oxygen partial pressure during film formation, as is disclosed in JP-A No. 2006-165529.

Of course, not only oxide semiconductors but also inorganic semiconductors, e.g., Si, Ge, etc., compound semiconductors, e.g., GaAs, etc., organic semiconductor materials, e.g., pentacene, polythiophene, etc., carbon nanotube, etc., are applicable to the active layer and the resistance layer.

<Electric Conductivity of Active Layer and Resistance Layer>

The active layer in the invention is contiguous to the gate insulating film, and has higher electric conductivity than the resistance layer that is in contact with the source electrode and the drain electrode.

The ratio of the electric conductivity of the active layer to the electric conductivity of the resistance layer (electric conductivity of active layer/electric conductivity of resistance layer) is preferably $10^1$ or more and $10^{10}$ or less, more preferably $10^2$ or more and $10^{10}$ or less, and still more preferably $10^2$ or more and $10^8$ or less. The electric conductivity of the active layer is preferably $10^{-4}$ Scm$^{-1}$ or more and less than $10^2$ Scm$^{-1}$, and more preferably $10^{-1}$ Scm$^{-1}$ or more and less than $10^2$ Scm$^{-1}$.

The electric conductivity of the resistance layer is preferably $10^{-2}$ Scm$^{-1}$ or less, and more preferably $10^{-9}$ Scm$^{-1}$ or more and $10^{-3}$ Scm$^{-1}$ or less.

<Film Thickness of Active Layer and Resistance Layer>

The thickness of the active layer is preferably 1 nm to 500 nm, more preferably 5 nm to 200 nm, and still more preferably, 10 nm to 100 nm.

The thickness of the resistance layer is preferably 1 nm to 100 nm, more preferably 2 nm to 80 nm, and still more preferably 5 nm to 50 nm.

In the invention, it is preferred that the thickness of the active layer is thicker than the thickness of the resistance layer. More preferably, the ratio of the thickness of the active layer/the thickness of the resistance layer is larger than 1 and 100 or smaller, and still more preferably larger than 1 and 10 or smaller.

When the ratio of active layer thickness/resistance layer thickness is 1 or smaller, the active layer through which electric current is flown is thinner as compared with the resistance layer, so that it is not preferred in the aspect of durability at the time of applying an electric current, while when the ratio is greater than 100, the effect of the resistance layer is not sufficient and ON/OFF ratio becomes small and so not preferred.

By using the active layer and the resistance layer of the foregoing constitutions, transistor characteristics of ON/OFF ratio of $10^6$ or more can be realized with TFT having high mobility of 10 cm$^2$/(V·sec) or more.

<Adjusting Method of Electric Conductivity>

When the active layer and the resistance layer are oxide semiconductors, electric conductivity can be adjusted according to the following method.

(1) Adjustment by Oxygen Defect

It is known that in an oxide semiconductor, when oxygen defect is made, carrier electron is generated and electric conductivity becomes large. Accordingly, it is possible to control electric conductivity of an oxide semiconductor by adjusting the quantity of oxygen defects. As specific method of controlling the quantity of oxygen defects, oxygen partial pressure during film formation, and oxygen concentration and treating time of post-treatment after film formation are exemplified. Post-treatment here means specifically heat treatment at 100° C. or higher, oxygen plasma, and UV ozone treatment. Of these treatments, the method of adjusting oxygen partial pressure during film formation is preferred in the light of productivity. The fact that the electric conductivity of an oxide semiconductor can be controlled by the adjustment of oxygen partial pressure during film formation is disclosed in JP-A No. 2006-165529, and this method can be used in the invention.

(2) Adjustment by Composition Ratio

It is known that electric conductivity varies by changing the ratio of the metal compositions of an oxide semiconductor. For example, it is disclosed in JP-A No. 2006-165529 that in InGaZn$_{1-x}$Mg$_x$O$_4$, when the ratio of Mg increases, electric conductivity becomes smaller. Further, it is reported that in oxides of (In$_2$O$_3$)$_{1-x}$(ZnO)$_x$, in the case where the ratio of Zn/In is 10% or more, electric conductivity becomes smaller with the increase of Zn ratio ("Tomei Dodenmaku no Shin-Tenkai II (New Development of Transparent Conductive Film II"), pp. 34-35, CMC Publishing Co., Ltd.). As a specific method for changing the ratio of composition, for example, targets different in the ratio of compositions are used in a film-forming method by sputtering. Alternatively, it is possible to change the ratio of compositions by co-sputtering with hypercomplex targets, and individually adjusting the sputtering rate.

(3) Adjustment by Impurities

It is disclosed in JP-A No. 2006-165529 that by the addition of elements such as Li, Na, Mn, Ni, Pd, Cu, Cd, C, N or P as an impurity to an oxide semiconductor, the electron carrier concentration can be reduced, that is, electric conductivity can be made small. As methods of adding an impurity, there are a method of co-depositing an oxide semiconductor and impurity element, and a method of doping an ion of impurity element to a formed oxide semiconductor film.

(4) Adjustment by Oxide Semiconductor Material

In the above methods (1) to (3), adjusting methods of electric conductivity in the same oxide semiconductor have been described, but it is of course possible to change electric conductivity by changing oxide semiconductor materials. For example, it is known that SnO$_2$ series oxide semiconductors are generally lower in electric conductivity as compared with In$_2$O$_3$ series oxide semiconductors. By changing oxide semiconductor materials like this, electric conductivity can be adjusted. As oxide materials having especially small electric conductivity, oxide insulator materials such as Al$_2$O$_3$, Ga$_2$O$_3$, ZrO$_2$, Y$_2$O$_3$, Ta$_2$O$_3$, MgO and HfO$_3$ are known, and these materials can also be used.

As method for adjusting electric conductivity, the above methods of (1) to (4) may be used alone, or they may be used in combination.

<Forming Methods of Active Layer and Resistance Layer>

It is good to use a vapor phase film-forming method as the film-forming method of the active layer and the resistance layer with the polycrystalline sintered body of an oxide semiconductor as a target. Of vapor phase film-forming methods, a sputtering method and a pulse laser deposition (PLD) method are suitable. From the point of mass production, a sputtering method is preferably used.

For example, a film is formed by controlling the degree of vacuum and oxygen flow rate according to an RF magnetron sputtering method. The greater the oxygen flow rate, the smaller can be made the electric conductivity.

A formed film can be confirmed to be an amorphous film by known X-ray diffraction methods.

Further, a film thickness can be found according to a measuring method of surface shape by a profilometer. A composition ratio can be found according to RBS (Rutherford back scattering) analysis.

5) Intermediate Layer

The intermediate layer in the invention contains an oxide containing an element having a stronger binding force with respect to oxygen than that of the oxide semiconductor in the active layer. The bonding force of a metal element and oxygen is a clear physical value defined as the bonding energy with oxygen in Japan Society for the Promotion of Science compiled, "Techniques of Transparent Conductive Films", p. 100, compiled by Photo-Electron Material-No. 166 Committee, "Transparent Oxides", published by Ohmsha Ltd., and Masahiro Hirano, "Transparent Oxide Functional Materials and Application Thereof", p. 104, compiled by Hideo Hosono, published by CMC Publishing Co., Ltd.

The intermediate layer in the invention is arranged between the active layer and the resistance layer. According to the constitution of TFT device, a film-forming process of the resistance layer follows film-forming of the active layer, or film-forming processes of the source electrode and drain electrode, and film-forming method such as an RF magnetron sputtering method is used in any process, the surface on which a film is formed is irradiated with plasma at film-forming time, and these processes are performed under the atmospheres of various oxygen partial pressures. Since a film comprising an oxide semiconductor, in particular, amorphous oxide semiconductor, oxygen defects on the surface decrease or increase in accordance with conditions when exposed to these conditions, semiconductor characteristics are conspicuously influenced. The intermediate layer of the invention containing an oxide containing an element having a stronger binding force with respect to oxygen is not influenced by the sputtering process by virtue of the strong binding force with respect to oxygen and stably maintains the strong binding force with respect to oxygen, so that the intermediate layer can prevent the influence from reaching the active layer of the lower layer. Accordingly, the intermediate layer has the effect of stably maintaining the semiconductor characteristics of the active layer.

Oxides containing an element having a stronger binding force with respect to oxygen than that of the oxide semiconductor in the active layer are preferably oxides containing at least one element selected from the group consisting of Ba, Ca, Ti, Fe, Ga, Mg, Al, Ge and Si, more preferably oxides containing at least one element selected from the group consisting of Ga, Mg, Al and Si, and still more preferably oxides containing Ga or Mg.

As the specific examples of the oxides containing an element having a stronger binding force with respect to oxygen than that of the oxide semiconductor in the active layer, the following oxides are exemplified, but the invention is not restricted to these oxides:

That is, $BaO$, $CaO$, $TiO_2$, $Fe_2O_3$, $Ga_2O_3$, $MgO$, $Al_2O_3$, $SiO_2$, $SiO$, and $GeO$.

As the oxides containing an element having a stronger binding force with respect to oxygen than that of the oxide semiconductor in the active layer, in addition to those described above, the oxides described in Japan Society for the Promotion of Science compiled, "Techniques of Transparent Conductive Films", compiled by Photo-Electron Material-No. 166 Committee, "Transparent Oxides", published by Ohmsha Ltd., and Masahiro Hirano, "Transparent Oxide Functional Materials and Application Thereof", compiled by Hideo Hosono, published by CMC Publishing Co., Ltd. can be used.

It is preferred for the intermediate layer in the invention to further contain an oxide semiconductor. As the oxide semiconductors for use in the intermediate layer, oxide semiconductors exemplified above as the oxide semiconductors for use in the active layer can be used. The oxide semiconductors for use in the intermediate layer may be the same with or different from the materials for use in the active layer. Further, as the oxide semiconductors for use in the intermediate layer, oxide semiconductors exemplified above as the oxide semiconductors for use in the resistance layer can be used. The oxide semiconductors for use in the intermediate layer may be the same with or different from the materials for use in the resistance layer.

The ratio of the content of the oxide semiconductor and the oxide containing an element having a stronger binding force with respect to oxygen than that of the oxide semiconductor in the active layer in the intermediate layer (oxide semiconductor/oxide containing an element having a stronger binding force with respect to oxygen than that of oxide semiconductor in active layer) is preferably 5/95 to 95/5 in a volume ratio, more preferably 10/90 to 90/10, and still more preferably 20/80 to 80/20.

When the ratio is less than 5/95, since the ratio of the oxide semiconductor material in the active layer is small, the damage of film-forming of the oxide containing an element having a stronger binding force with respect to oxygen is directly given to the active layer, which is not preferred, while when the ratio exceeds 95/5, the oxide semiconductor material constituting the intermediate layer approaches the structure of the oxide semiconductor material constituting the active layer, and the effect of the intermediate layer lessens, which is not preferred.

For example, when the oxide semiconductor is IGZO, and the oxide containing an element having a stronger binding force with respect to oxygen than that of the oxide semiconductor of the active layer is $Ga_2O_3$, if the ratio of the oxide semiconductor/the oxide containing an element having a stronger binding force with respect to oxygen than that of the oxide semiconductor of active layer is 5/95 to 95/5 in a volume ratio, the atomic ratio of In and Ga to be obtained is from 2%/95% to 46%/54%.

The thickness of the intermediate layer in the invention is preferably 1 nm to 200 nm, more preferably 2 nm to 100 nm, and still more preferably 3 nm to 50 nm.

The thickness of less than 1 nm is thinner as the intermediate layer, and the active layer is affected by the film-forming time of the resistance layer and not preferred, while it exceeds 200 nm, the distance from the source and drain electrodes to the active layer is physically too large and disadvantageous to apply an electric current.

As the relative relationship between the active layer and the intermediate layer in the invention, the thickness of the active layer is larger than the thickness of the intermediate layer. More preferably, the ratio of the thickness of active layer/thickness of the intermediate layer is from 0.1 to 100, and still more preferably from 1 to 10.

When the ratio of the thickness of active layer/thickness of the intermediate layer is 0.1 or less, the active layer through which a current is flown is small as compared with the intermediate layer, so that not preferred in the point of durability when applying current, while when it exceeds 100, the thickness of the intermediate layer is thinner as compared with the preferred thickness of the active layer, as a result prevention of damage at the time of film forming is insufficient and not preferred.

6) Gate Electrode

As the gate electrode in the invention, for example, metals such as Al, Mo, Cr, Ta, Ti, Au, Ag, etc., alloys such as Al—Nd, APC, etc., metal oxide conductive films such as tin oxide, zinc oxide, indium oxide, indium tin oxide (ITO), indium zinc oxide (IZO), etc., organic conductive compounds such as polyaniline, polythiophene, pylypyrrole, etc., and mixtures thereof are preferably exemplified.

The thickness of the gate electrode is preferably from 10 nm to 1,000 nm, more preferably from 20 nm to 500 nm, and still more preferably from 40 nm to 100 nm.

The film-forming method of the gate electrode is not restricted. The gate electrode can be formed on the substrate according to an arbitrary method selected from wet methods such as a printing method, a coating method, etc., physical methods such as a vacuum deposition method, a sputtering method, an ion-plating method, etc., and chemical methods such as a CVD method, a plasma CVD method, etc., considering the suitability with the materials. For example, when ITO is selected, the gate electrode can be formed according to a direct current or a high frequency sputtering method, a vacuum deposition method, or an ion-plating method. When an organic conductive compound is selected as the material of the gate electrode, wet film-forming methods can be used.

7) Source Electrode and Drain Electrode

As the materials of the source electrode and drain electrode in the invention, metals, e.g., Al, Mo, Cr, Ta, Ti, Au, Ag, etc., alloys, e.g., Al—Nd, APC, etc., metal oxide conductive films, e.g., tin oxide, zinc oxide, indium oxide, indium tin oxide (ITO), indium zinc oxide (IZO), etc., organic conductive compounds, e.g., polyaniline, polythiophene, pylypyrrole, etc., and mixtures thereof are preferably exemplified.

The thickness of the source electrode and drain electrode is preferably from 10 nm to 1,000 nm, more preferably from 20 nm to 500 nm, and still more preferably from 40 nm to 100 nm.

As the patterning method of the source electrode and drain electrode, conventionally known various methods can be used. For example, a method of combining a photolithographic method with etching, a method of combining a photolithographic method with a lift-off method, a method by metal mask, and printing and inkjet methods are known. For forming a fine pattern, a method of combining a photolithographic method with etching and a method of combining a photolithographic method with a lift-off method are preferably used.

A process of patterning by a photolithographic method and a lift-off method is typically shown in FIG. 4. (FIG. 4A) On the substrate are provided a gate electrode and gate insulating film, and thereon (FIG. 4B) an oxide semiconductor layer is formed as the active layer by a sputtering deposition method. (FIG. 4C) Resist patterns are provided thereon by a photolithographic method. Subsequently, (FIG. 4D) a source/drain electrode film is formed on the entire surface. A sputtering method is also used in this process. Finally, (FIG. 4E) the resist is dissolved with an alkali solution and the like, and the source/drain electrode film at the corresponding area is removed with the resist. As a result, the source electrode and the drain electrode are formed at the remained part.

As is apparent from the above explanation, in the case of the lift-off method, in the process of forming the source/drain electrode film, the channel-forming region of the active layer is protected with the resist. However, in the case of the patterning method, the ends where the resists are removed are remained as they are, so that the shapes of the ends are not uniform and there is a limit in highly fine pattern formation.

On the other hand, in a patterning process by a photolithographic method and an etching method shown in FIG. 5, similarly to the lift-off method, (FIG. 5A) On the substrate are provided a gate electrode and gate insulating film, and thereon (FIG. 5B) the active layer has been formed, (FIG. 5C) a source/drain electrode film is formed on the entire surface by the sputtering deposition method. (FIG. 5D) Resist patterns are provided thereon by a photolithographic method. In the next place, (FIG. 5E) the source/drain electrode film at the place not protected with the resist is dissolved with an etchant and removed. Finally, (FIG. 5F) the resist is dissolved with an alkali solution and the like. As a result, the source electrode and the drain electrode are formed.

As is apparent from the above explanation, there are at least two problems in patterning by the etching method.

A first problem is that the active layer is damaged in (FIG. 5C) a source/drain electrode film-forming process, so that semiconductor characteristics are deteriorated.

A second problem is that, after the source/drain electrode film has been subjected to etching in the etching process, the active layer is difficult to avoid being in contact with the etchant. The reason is that since the etching rate of an oxide semiconductor is generally fast as compared with ITO or Al of source/drain electrode material, if an oxide semiconductor is brought into contact with an etchant on the etching condition of source/drain electrode, the oxide semiconductor is swiftly corroded.

The intermediate layer in the invention can solve these two problems at the same time. That is to say, as shown in FIG. 6, in the film-forming process (FIG. 6D) of the source/drain electrode film, since the surface of the active layer is protected with the intermediate layer, the active layer is not damaged by plasma irradiation and the like. Further, in etching process (FIG. 6F), the active layer is segregated by the intermediate layer even after the source/drain electrode film have been subjected to etching. Accordingly, the active layer is not directly brought into contact with the etchant.

Therefore, according to the invention, a patterning method by a photolithographic method and etching can be adopted, so that highly refined patterning is possible.

8) Substrate

Substrates for use in the invention are not especially restricted, and for example, inorganic materials such as YSZ (yttria-stabilized zirconia), glass, etc., and organic materials such as synthetic resins, such as polyester, e.g., polyethylene terephthalate, polybutylene terephthalate, polyethylene naphthalate, etc., polystyrene, polycarbonate, polyether sulfone, polyallylate, allyl diglycol carbonate, polyimide, polycycloolefin, norbornene resin, poly(chlorotrifluoroethylene) etc., are exemplified. The organic materials are preferred in the point that they are excellent in heat resistance, dimensional stability, solvent resistance, an electric insulating property, processability, low air permeability, and low hygroscopicity.

Flexible substrates are especially preferably used in the invention. As the materials for use as flexible substrates, organic plastic films high in transmittance are preferred, and plastic films such as polyester, e.g., polyethylene terephthalate, polybutylene terephthalate, polyethylene naphthalate, etc., polystyrene, polycarbonate, polyether sulfone, polyallylate, polyimide, polycycloolefin, norbornene resin, poly (chlorotrifluoroethylene) etc., can be used. Further, it is also preferred to provide on a film state plastic substrate an insulating layer when an insulating property is insufficient, a gas barrier layer for preventing moisture content and oxygen from permeating, and an undercoat layer for improving flatness of a film state plastic substrate and adhesion to the electrode and the active layer.

The thickness of the flexible substrate is preferably from 50 μm to 500 μm. When the thickness of the flexible substrate is less than 50 μm, it is difficult for the substrate itself to retain sufficient flatness. When the thickness of the flexible substrate excesses 500 μm, it becomes difficult to freely bend the substrate itself, that is, the substrate lacks flexibility.

9) Protective Insulating Film

If necessary, a protective insulating film may be provided on TFT. The protective insulating film has the purpose of protecting the semiconductor layer of the active layer or the resistance layer from deterioration by atmospheric air, or the purpose of insulating from an electron device formed on TFT.

As the specific examples of the protective insulating film, metal oxides, e.g., MgO, SiO, $SiO_2$, $Al_2O_3$, GeO, NiO, CaO, BaO, $Fe_2O_3$, $Y_2O_3$, $TiO_2$, etc., metal nitrides, e.g., $SiN_x$, $SiN_xO_y$, etc., metal fluorides, e.g., $MgF_2$, LiF, $AlF_3$, $CaF_2$, etc., polyethylene, polypropylene, polymethyl methacrylate, polyimide, polyurea, polytetrafluoroethylene, polychlorotrifluoro-ethylene, polydichlorodifluoroethylene, a copolymer of chlorotrifluoroethylene and dichlorodifluoroethylene, a copolymer obtained by copolymerization of tetrafluoroethylene and a monomer mixture containing at least one comonomer, a fluorine-containing copolymer having a cyclic structure in a copolymer main chain, a water-absorbing material having a water-absorption coefficient of 1% or more, and a moisture-proofing material having a water-absorption coefficient of 0.1% or less are exemplified.

The method for forming the protective insulating film is not especially restricted. For example, a vacuum deposition method, a sputtering method, a reactive sputtering method, an MBE (molecular beam epitaxy) method, a cluster ion beam method, an ion-plating method, a plasma polymerization method (a high frequency exciting ion-plating method), a plasma CVD method, a laser CVD method, a thermal CVD method, a gas source CVD method, a coating method, a printing method, and a transfer method can be applied.

10) Post-Treatment

If necessary, heat treatment may be carried out as the post-treatment of TFT. The heat treatment is performed at a temperature of 100° C. or more in the atmospheric air or nitrogen. The heat treatment may be performed after forming a semiconductor layer, or may be carried out in the last of the TFT manufacturing process. By performing the heat treatment, in-plane dispersion of the characteristics of TFT can be restrained and driving stability is improved.

2. Display

The field-effect thin film transistor of the invention is preferably used in image displays using liquid crystal and EL element, in particular, flat panel display (FPD), and more preferably used in a flexible display using a flexible substrate such as an organic plastic film. Since the field-effect thin film transistor of the invention is high in field-effect mobility, it is most preferably used in a display using an organic EL element and a flexible organic EL display.

3. Organic EL Element

An organic EL element in the invention may have conventionally known organic compound layers such as a hole transporting layer, an electron transporting layer, a blocking layer, an electron injecting layer, and a hole injecting layer, in addition to a light-emitting layer.

The organic electroluminescence element of the invention will be described in detail hereinafter.

1) Layer Structure

<Electrodes>

At least one of the pair electrodes of the organic electroluminescence element of the invention is a transparent electrode, and the other is a back plate. The back plate may be transparent or opaque.

<Structure of the Organic Compound Layer>

The layer structure of the organic compound layer is not particularly limited, and may be suitably selected in accordance with the usage of the organic electroluminescence element or the object thereof. Preferably, the organic compound layer is formed on the transparent electrode or on the back plate. In this case, the organic compound layer is formed on the front surface or the rear surface of the transparent electrode or the back plate.

The shape, the size, the thickness and other factors of the organic compound layer are not particularly limited, and can be suitably selected in accordance with the object.

Specific examples of the layer structure include the following. In the invention, however, the layer structure is not limited to these structures.

1. Anode/hole transporting layer/light emitting layer/electron transporting layer/cathode
2. Anode/hole transporting layer/light emitting layer/blocking layer/electron transporting layer/cathode
3. Anode/hole transporting layer/light emitting layer/blocking layer/electron transporting layer/electron injecting layer/cathode
4. Anode/hole injecting layer/hole transporting layer/light emitting layer/blocking layer/electron transporting layer/cathode
5. Anode/hole injecting layer/hole transporting layer/light emitting layer/blocking layer/electron transporting layer/electron injecting layer/cathode Each of the layers will be described in detail hereinafter.

2) Hole Transporting Layer

The hole transporting layer used in the invention comprises a hole transporting material. As the hole transporting material, a material having any one of a function of transporting holes and a function of blocking electrons injected from the cathode can be used without any special limitation. The hole transporting material used in the invention may be any one of a low molecular weight hole transporting material and a high molecular weight hole transporting material.

Specific examples of the hole transporting material used in the invention include the following:

A carbazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stylbene derivative, a silazane derivative, an aromatic tertiary amine compound, a styrylamine compound, an aromatic dimethylidene compound, a porphyrin compound, a polysilane compound, a poly(N-vinylcarbazole) derivative, electroconductive polymers or oligomers such as an aniline copolymer, a thiophene oligomer and polythiophene, a polythiophene derivative, a polyphenylene derivative, a polyphenylenevinylene derivative, a polyfluorene derivative, and other polymer compounds.

These may be used alone or in combination of two or more kinds thereof.

The thickness of the hole transporting layer is preferably 1 nm to 200 nm, more preferably 5 nm to 100 nm.

3) Hole Injecting Layer

In the invention, a hole injecting layer may be formed between the hole transporting layer and the anode.

The hole injecting layer is a layer which makes it easy to inject holes from the anode to the hole transporting layer. Specifically, a material having a small ionization potential among the above-mentioned various hole transporting materials is preferably used. Examples of the material include a phthalocyanine compound, a porphyrin compound, and a star-burst triarylamine compound. These can be preferably used.

The film thickness of the hole injecting layer is preferably 1 nm to 300 nm.

4) Light-Emitting Layer

The light-emitting layer used in the invention comprises at least one light-emitting material, and may contain a hole transporting material, an electron transporting material, and a host material if necessary.

The light-emitting material used in the invention is not particularly limited, and may be any one of a fluorescent light-emitting material and a phosphorescent light-emitting material. The phosphorescent light-emitting material is preferable from the viewpoint of light-emitting efficiency.

Examples of the fluorescent light-emitting material include a benzooxazole derivative, a benzoimidazole derivative, a benzothiazole derivative, a styrylbenzene derivative, a polyphenyl derivative, a diphenylbutadiene derivative, a tetraphenylbutadiene derivative, a naphthalimide derivative, a coumalin derivative, a perylene derivative, a perynone derivative, an oxadiazole derivative, an aldazine derivative, a pyralizine derivative, a cyclopentadiene derivative, a bisstyrylanthracene derivative, a quinacridone derivative, pyrrolopyridine derivative, a thiadiazolopyridine derivative, a styrylamine derivative, an aromatic dimethylidene compound, various metal complexes, typical example of which include a metal complex of an 8-quinolinol derivative or a rare earth complex, and polymeric compounds such as a polythiophene derivative, a polyphenylene derivative, a polyphenylenevinylene derivative, and a polyfluorene derivative. These may be used alone or in combination of two or more kinds thereof.

The phosphorescent light-emitting material is not particularly limited, and is preferably an orthometal metal complex or a porphyrin complex.

The above-mentioned orthometal metal complex is the generic name for the compound group mentioned in "Organic metal chemistry-basic and application—" written by Akio Yamamoto, p. 150, p. 232, Shokabo Publishing Co., Ltd., (published in 1982), "Photochemistry and photophysics of coordination compounds" written by H. Yersin, p. 71 to 77, p. 135 to 146, Springer-Verlag (published in 1987) and the like. It is advantageous to use the orthometal metal complex in the luminescent layer as the light-emitting material in terms of obtaining a high luminosity and an excellent light-emitting efficiency.

Various kinds of ligands can be used for forming the above-mentioned orthometal metal complex, and examples thereof are described in the above-mentioned articles. Among them, preferable examples of the ligands include a 2-phenyl pyridine derivative, a 7,8-benzoquinoline derivative, a 2-(2-thienyl)pyridine derivative, a 2-(1-naphtyl)pyridine derivative, a 2-phenyl quinoline derivative and the like. These derivative s may have a substituent in accordance with necessity. Moreover, the above-mentioned orthometal metal complex may have another ligand in addition to the above-mentioned ligand.

The orthometal metal complex used in the present invention can be synthesized by various known methods such as those mentioned in: Inorg Chem., vol. 30, p. 1685 (1991); Inorg Chem., vol. 27, p. 3464 (1988); Inorg Chem., vol. 33, p. 545(1994); Inorg. Chim. Acta, vol. 181, p. 245 (1991); J. Organomet. Chem., vol. 335, p. 293 (1987); J. Am. Chem. Soc. vol. 107, p. 1431 (1985); or the like.

Among the above-mentioned orthometal complexes, a compound which provide light emission by a triplet exciton can be preferably used in the present invention in terms of improvement of the light-emitting efficiency.

Moreover, among the porphyrin complexes, a porphyrin platinum complex is preferable. The phosphorescent light-emitting materials may be used alone or in combination of two or more kinds thereof. One or more kinds of the fluorescent light-emitting materials and one or more kinds of the phosphorescent light-emitting materials may be used together.

The host material is a material which has a function of moving energy from an excited state thereof to a fluorescent light-emitting material or a phosphorescent light-emitting material, so as to cause the fluorescent or phosphorescent light-emitting material to emit light.

The host material is not particularly limited if the material is a compound capable of moving the energy of its excitons to the light-emitting material, and can be suitably selected in accordance with the purpose of the electroluminescence element. Specific examples thereof include a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydorazone derivative, a stylbene derivative, a silazane derivative, an aromatic tertiary amine compound, a styrylamine compound, an aromatic dimethylidene compound, a porphyrin compound, an anthraquinodimethane derivative, an anthrone derivative, a diphenylquinone derivative, a thiopyrandioxide derivative, a carbodiimide derivative, a fluorenylidenemethane derivative, a distyrylpyrazine derivative, heterocyclic tetracarboxylic acid anhydrides such as naphthaleneperylene, various metal complexes, typical examples of which include metal complexes of a phthalocyanine derivative or 8-quinolinol derivative, metal phthalocyanine, and metal complexes each having, as a ligand thereof, benzooxazole or benzothiazole, electroconductive polymers/oligomers such as a polysilane compound, a poly(N-vinylcarbazole) derivative, an aniline copolymer, a thiophene oligomer and polythiophene, and polymeric compounds such as a polythiophene derivative, a polyphenylene derivative, a polyphenylenevinylene derivative and a polyfluorene derivative. These may be used alone or in combination of two or more kinds thereof.

The content by percentage of the host material in the light-emitting layer is preferably 20 to 99.9% by mass, more preferably 50 to 99.0% by mass.

5) Blocking Layer

A blocking layer may be formed between the light-emitting layer and the electron transporting layer in the invention. The blocking layer is a layer for restraining the diffusion of excitons generated in the light-emitting layer, or restraining holes from penetrating toward the cathode.

The material used in the blocking layer is not particularly limited if the material is a material capable of receiving electrons from the electron transporting layer and delivering the electrons to the light-emitting layer. The material may be an ordinary electron transporting material. Examples thereof include the following: a triazole derivative, an oxazole derivative, an oxadiazole derivative, a fluorenone derivative, an anthraquinodimethane derivative, an anthrone derivative, a diphenylquinone derivative, a thiopyrandioxide derivative, a carbodiimide derivative, a fluorenylidenemethane derivative, a distyrylpyrazine derivative, heterocyclic tetracarboxylic acid anhydrides such as naphthaleneperylene, various metal complexes, typical examples of which include metal complexes of a phthalocyanine derivative or 8-quinolinol derivative, metal phthalocyanine, and metal complexes each having, as a ligand thereof, benzooxazole or benzothiazole, electroconductive polymers/oligomers such as an aniline copolymer, a thiophene oligomer and polythiophene, and polymeric compounds such as a polythiophene derivative, a polyphenylene derivative, a polyphenylenevinylene derivative and a polyfluorene derivative. These may be used alone or in combination of two or more kinds thereof.

6) Electron Transporting Layer

An electron transporting layer comprising an electron transporting material can be deposited in the invention.

The electron transporting material is not limited if the material is a material having any one of a function of transporting electrons and a function of blocking holes injected from the anode. Examples of the electron transporting material given in the description of the blocking layer can be preferably used.

The thickness of the electron transporting layer is preferably 10 to 200 nm, more preferably 20 to 80 nm.

If the thickness is more than 1000 nm, the driving voltage may unfavorably rise. If the thickness is less than 10 nm, the light-emitting element may unfavorably short-circuit.

7) Electron Injecting Layer

An electron injecting layer may be formed between the electron transporting layer and the cathode in the invention.

The electron injecting layer is a layer which makes it easy to inject electrons from the cathode to the electron transporting layer. Preferable examples of the material used in this layer include alkali metal salts such as lithium fluoride, lithium chloride, lithium bromide, other lithium salts, sodium fluoride, sodium chloride and cesium fluoride, and insulating metal oxides such as lithium oxide, aluminum oxide, indium oxide and magnesium oxide.

The film thickness of the electron injecting layer is preferably 0.1 nm to 5 nm.

8) Substrate

The material of the substrate used in the invention is preferably a material through which water content cannot permeate, or a material having a very low water content permeability. Also, the material is preferably a material which does not cause scattering or attenuation of light emitted from the organic compound layer. Specific examples thereof include inorganic materials such as YSZ (zirconia-stabilized yttrium) and glass, and organic materials such as polyethylene terephthalate, polybutylene terephthalate, polyethylene naphthalate, other polyesters, polystyrene, polycarbonate, polyethersulfone, polyarylate, allyl diglycol carbonate, polyimide, polycycloolefin, norbornene resin, poly(chlorotrifluoroethylene) and other synthetic resins. In the case of the organic materials, it is preferred that the organic materials are organic materials excellent in heat resistance, dimensional stability, solvent resistance, electric non-conductance, workability, low gas permeability and low hygroscopicity. The above-mentioned materials may be used alone or in combination of two or more kinds thereof.

The shape, structure and size of the substrate and other factors thereof are not particularly limited, and can be suitably selected in accordance with the usage and purpose of the electroluminescence element. In general, the shape is a shape of a plate. The structure may be a mono-layered structure or a laminated structure. The substrate may be made of a single member, or two or more members.

The substrate may be transparent and colorless, or transparent and colored. The substrate is preferably transparent and colorless since the substrate does not cause scattering or attenuation of light emitted from the light-emitting layer.

It is preferable to form a moisture permeation preventing layer (gas barrier layer) on the front surface or the rear surface (on the side of the transparent electrode) of the substrate. The material of this layer is preferably an inorganic material such as silicon nitride or silicon oxide. This layer can be formed by, for example, high-frequency sputtering.

If necessary, a hard coat layer, an undercoat layer, or some other layer may be formed on the substrate.

9) Electrode

Either electrode used in the organic electroluminescence element may be used as anode or cathode. However, a first electrode is preferably anode and a second electrode is preferably cathode.

<Anode>

It is usually sufficient that the anode used in the invention has a function of supplying holes to the organic compound layer. The shape, structure and size thereof, and other factors thereof are not particularly limited, and can be suitably selected from known anodes in accordance with the usage and the purpose of the electroluminescence element.

Preferable examples of the material of the anode include metals, alloys, metal oxides, organic electroconductive compounds, and mixtures thereof. The material is preferably a material having a work function of 4.0 eV or more. Specific examples thereof include semiconductive metal oxides such as a tin oxide doped with antimony or fluorine (ATO, or FTO), tin oxide, zinc oxide, indium oxide, indium tin oxide (ITO) and indium zinc oxide (IZO), metals such as gold, silver, chromium and nickel, mixtures or laminates each made of one or more of these metals and an electroconductive metal oxide, inorganic electroconductive materials such as copper iodide and copper sulfide, organic electroconductive materials such as polyaniline, polythiophene and polypyrrole, and laminates each composed of one or more of these compounds and ITO.

The anode can be formed on the substrate in accordance with a method selected suitably, under consideration of suitability for the anode material, from wet methods such as printing and coating, physical methods such as vacuum vapor deposition, sputtering and ion plating, chemical methods such as CVD and plasma CVD, and other methods. In the case of selecting, for example, ITO as the anode material, the anode can be formed by direct current or high-frequency sputtering, vacuum vapor deposition, ion plating or the like. In the case of selecting an organic electroconductive compound as the anode material, the anode can be formed by any wet film-forming method.

The position where the anode is formed in the electroluminescence element is not particularly limited, and can be suitably selected in accordance with the usage and the purpose of this element. The anode is preferably formed on the substrate. In this case, the anode may be formed on the whole of a surface of the substrate or on a part of the surface.

The anode may be patterned by a chemical etching such as photolithography or a physical etching such as laser etching. The patterning may be attained by vacuum vapor deposition or sputtering in a state that a mask is overlapped with the anode which has not yet been patterned, or may be attained by a lift-off method or a printing method.

The thickness of the anode can be suitably selected in accordance with the anode material. The thickness, which cannot be specified without reservation, is usually from 10 nm to 50 µm, preferably 50 nm to 20 µm.

The resistance value of the anode is preferably $10^3 \Omega$/sq. or less, more preferably $10^2 \Omega$/sq. or less.

The anode may be transparent and colorless, or transparent and colored. In order to take out light emitted from the side of the anode, the transmittance thereof is preferably 60% or more, more preferably 70% or more. This transmittance can be measured in a known method using a spectrophotometer.

Details of anodes are described in "New Development of Transparent Electrode Films", supervised by Yutaka Sawada and published by CMC (1999). These can be applied to the invention. The anode in the case of using a plastic substrate with low heat resistance is preferably an anode obtained by making ITO or IZO into a film at a low temperature of 150° C. or lower.

<Cathode>

It is usually sufficient that the cathode, which can be used in the invention, has a function of injecting electrons into the organic compound layer. The shape, structure and size thereof, and other factors thereof are not particularly limited, and can be suitably selected from known cathodes in accordance with the usage and the purpose of the electroluminescence element.

Examples of the material of the cathode include metals, alloys, metal oxides, organic electroconductive compounds, and mixtures thereof. The material is preferably a material having a work function of 4.5 eV or less. Specific examples thereof include alkali metals (such as Li, Na, K and Cs), alkaline earth metals (such as Mg, and Ca), gold, silver, lead, aluminum, sodium-potassium alloy, lithium-aluminum alloy, magnesium-silver alloy, indium, and rare earth metals such as ytterbium. These may be used alone. However, in order to make the stability and electron-injecting property of the cathode compatible with each other, it is preferable to use two or more kinds thereof together.

Among them, alkali metals or alkaline earth metals are preferable from the viewpoint of electron injecting property. A material made mainly of aluminum is preferable since the material is excellent in storage stability. The material made mainly of aluminum means aluminum alone, or any alloy or mixture made of aluminum and 0.01 to 10% by mass of an alkali metal or alkaline earth metal (for example, lithium-aluminum alloy, or magnesium-aluminum alloy).

Materials of the cathode are described in detail in JP-A Nos. 2-15595 and 5-121172. These can be applied to the invention.

The method for forming the cathode is not particularly limited, and may be a known method. For example, the cathode can be formed on the substrate in accordance with a method selected suitably, under consideration of suitability for the cathode material, from wet methods such as printing and coating, physical methods such as vacuum vapor deposition, sputtering and ion plating, chemical methods such as CVD and plasma CVD, and other methods. In the case of selecting, for example, one or two or more kinds metals as the cathode material, the cathode can be formed thinly by sputtering the metal or by sputtering the metals simultaneously or successively.

The cathode may be patterned by a chemical etching such as photolithography or a physical etching such as laser etching. The patterning may be attained by vacuum vapor deposition or sputtering in a state that a mask is overlapped with the cathode which has not yet been patterned, or may be attained by a lift-off method or a printing method.

The position where the cathode is formed in the organic electroluminescence element is not particularly limited, and can be suitably selected in accordance with the usage and the purpose of this element. The cathode is preferably formed on the organic compound layer. In this case, the cathode may be formed on the whole of the organic compound layer or on a part of the layer.

A dielectric layer made of an alkali metal fluoride, an alkaline earth metal fluoride or the like may be inserted between the cathode and the organic compound layer so as to have a thickness of 0.1 nm to 5 nm.

The thickness of the cathode can be suitably selected in accordance with the cathode material. The thickness, which cannot be specified without reservation, is usually from 10 nm to 5 µm, preferably 20 nm to 500 nm.

The cathode may be transparent or opaque. The transparent electrode can be formed by making the cathode material into a film having a small thickness of 1 to 10 nm and then laminating a transparent electroconductive material such as ITO or IZO onto the film.

10) Protective Layer

In the invention, the whole of the organic EL element may be protected with a protective layer.

Materials contained in the protective layer may be those having a function of preventing substances (for example, water and oxygen) accelerating deterioration of the element from entering the element.

Specific examples include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal nitrides such as $SiN_x$ and $SiN_xO_y$, metal fluorides such as $MgF_2$, LiF, $AlF_3$ and $CaF_2$, polyethylene, polypropylene, polymethyl methacrylate, polyimide, polyurea, polytetrafluoroethylene, polychlorotrifluoroethylene, polydichlorodifluoroethylene, a chlorotrifluoroethylene/dichlorodifluoroethylene copolymer, a copolymer obtained by copolymerizing a monomer mixture containing tetrafluoroethylene and at least one kind of comonomer, a fluorine-containing copolymer having a cyclic structure in a copolymer main chain, a water-absorbing substance with a water absorption percentage of 1% or more, and a dampproof substance with a water absorption percentage of 0.1% or less.

The method of forming the protective layer is not particularly limited and can use, for example, a vacuum deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas-source CVD method, a coating method, a printing method, or a transfer method.

11) Sealing

In addition, the whole of the organic electroluminescence element in the invention may be sealed with a sealing container.

A water absorbent or an inert liquid may be sealed in a space between the sealing container and the light-emitting element.

The water absorbent includes, but is not limited to, barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. The inert liquid includes, but is not limited to, paraffins, liquid paraffins, fluorine solvents such as perfluoroalkane, perfluoroamine and perfluoroether, chlorine solvents and silicone oil.

12) Method for Manufacturing the Element

The layers constituting the element in the invention can be produced preferably by either a dry film-making method such as a vapor deposition method and a sputtering method, or a wet film-making method such as dipping, a spin coating method, a dip coating method, a casting method, a die coating method, a roll coating method, a bar coating method, and a gravure coating method.

Particularly, the dry method is preferable from the viewpoint of emission efficiency and durability. The wet film-making method is not preferable because a remaining coating solvent damages the light-emitting layer.

A resistance heating vacuum deposition method is particularly preferable. The resistance heating vacuum deposition method is advantageous in that since only a substance to be evaporated by heating under vacuum can be efficiently heated, the element is not exposed to high temperature and is thus less damaged.

Vacuum deposition is a method wherein in a vacuum container, a material to be vapor-deposited is gasified or sublimated by heating and then adhered by deposition onto the surface of a material placed a little distance away, thereby forming a thin film. Depending on the type of a deposition material and a material receiving the deposition material, the material is heated by a method such as resistance heating, electron beam method, high-frequency induction, or laser method. Among these methods, the vacuum deposition method in a resistance heating system is a method of forming a film at lowest temperature, wherein a material of high sublimation point cannot be formed into a film, but a material of low sublimation point can be formed into a film of a deposited material in a scarcely damaged state.

The sealing film material in the invention is characterized by being capable of being formed into a film with vacuum deposition in a resistance heating system. Conventionally used sealants such as silicon oxide have a high sublimation point and have been hardly vapor-deposited by resistance heating. By the vapor deposition method such as an ion plating system described generally in known examples, a deposition origin is heated to an ultrahigh-temperature of several thousand degrees Celsius, thus thermally influencing and deteriorating a deposited material, and therefore the vapor deposition method is not suitable for the method of manufacturing a sealing film for an organic EL element to be particularly liable to influence by heating or with ultraviolet light.

13) Driving Method

The organic electroluminescence element in the invention can emit light by applying DC (which may if necessary contain an AC component) voltage cross the anode and cathode (usually 2 to 15 volts) or by applying DC electricity.

The method of driving the organic electroluminescence element in the invention can use driving methods described in JP-A Nos. 2-148687, 6-301355, 5-29080, 7-134558, 8-234685, 8-241047, Japanese Patent No. 2784615, U.S. Pat. No. 5,828,429 and U.S. Pat. No. 6,023,308.

(Application)

The field-effect thin film transistor of the invention can be used in an image display using liquid crystal and EL device, in particular, as a switching device and driving device of a FPD. In particular, the field-effect thin film transistor of the invention is preferably applicable for using as a switching device and driving device of a flexible FPD. Further, a display using the field-effect thin film transistor of the invention can be applied to wide fields including a portable telephone display, a personal digital assistant (PDA), a computer display, an information display of automobile, a TV monitor, and general illumination.

Besides displays, the field-effect thin film transistor of the invention can be widely used in IC cards and ID tags by forming the field-effect thin film transistor of the invention on a flexible substrate such as an organic plastic film.

Exemplary embodiments of the invention are enumerated below.

<1> A thin film field-effect transistor comprising a substrate having thereon at least a gate electrode, a gate insulating film, an active layer, a source electrode, and a drain electrode, wherein the active layer is an oxide semiconductor layer, a resistance layer having an electric conductivity that is lower than an electric conductivity of the active layer is provided between the active layer and at least one of the source electrode or the drain electrode, and an intermediate layer comprising an oxide comprising an element having a stronger bonding force with respect to oxygen than that of the oxide semiconductor in the active layer is provided between the active layer and the resistance layer.

<2> The thin film field-effect transistor as described in item <1>, wherein the oxide comprising an element having a strong bonding force with respect to oxygen contained in the intermediate layer is an oxide containing at least one element selected from the group consisting of Ba, Ca, Ti, Fe, Ga, Mg, Al, Ge and Si.

<3> The thin film field-effect transistor as described in item <1> or <2>, wherein the resistance layer is an oxide semiconductor layer.

<4> The thin film field-effect transistor as described in any of items <1> to <3>, wherein the electric conductivity of the active layer is $10^{-4}$ Scm$^{-1}$ or more and less than $10^2$ Scm$^{-1}$, and the ratio of the electric conductivity of the active layer to the electric conductivity of the resistance layer (electric conductivity of active layer/electric conductivity of resistance layer) is from $10^1$ to $10^{10}$.

<5> The thin film field-effect transistor as described in any of items <1> to <4>, wherein the intermediate layer further contains an oxide semiconductor.

<6> The thin film field-effect transistor as described in item <4> or <5>, wherein the electric conductivity of the active layer is $10^{-1}$ Scm$^{-1}$ or more and less than $10^2$ Scm$^{-1}$.

<7> The thin film field-effect transistor as described in any of items <4> to <6>, wherein the ratio of the electric conductivity of the active layer to the electric conductivity of the resistance layer (electric conductivity of active layer/electric conductivity of resistance layer) is from $10^2$ to $10^{10}$.

<8> The thin film field-effect transistor as described in item <7>, wherein the ratio of the electric conductivity of the active layer to the electric conductivity of the resistance layer (electric conductivity of active layer/electric conductivity of resistance layer) is from $10^2$ to $10^8$.

<9> The thin film field-effect transistor as described in any of items <1> to <8>, wherein the oxide semiconductor of the active layer is an amorphous oxide.

<10> The thin film field-effect transistor as described in any of items <3> to <9>, wherein the oxide semiconductor of the resistance layer is an amorphous oxide.

<11> The thin film field-effect transistor as described in any of items <5> to <10>, wherein the oxide semiconductor of the intermediate layer is an amorphous oxide.

<12> The thin film field-effect transistor as described in any of items <1> to <11>, wherein the thickness of the active layer is thicker than the thickness of the resistance layer.

<13> The thin film field-effect transistor as described in any of items <1> to <12>, wherein the substrate is a flexible resin substrate.

<14> A display using the thin film field-effect transistor as described in any of items <1> to <13>.

EXAMPLES

The thin film field-effect transistor in the invention will be explained with reference to examples, but the invention is by no means restricted thereto.

Example 1

1. Manufacture of TFT Device
1) Manufacture of TFT Device 1 of the Invention TFT device having the cross sectional structure shown in FIG. 2 was manufactured.

As a substrate, non-alkali glass plate (product No. 1737, manufactured by Corning Inc.) was used. The substrate was subjected to ultrasonic wave washing with pure water for 15 minutes, with acetone for 15 minutes, and with pure water for 15 minutes in order. An ITO thin film (thickness: 30 nm) as a gate electrode was formed on the substrate by using indium tin oxide (ITO) target containing 10 mass % of $SnO_2$ (indium/tin=95/5 in a molar ratio) according to RF magnetron sputtering (conditions of a film-forming temperature: 43° C., sputtering gas Ar: 12 sc cm, RF power: 40 W, film-forming pressure: 0.4 Pa). In patterning of the gate electrode ITO, a shadow mask was used at the time of sputtering.

In the next place, the following gate insulating film was formed on the gate electrode.

A gate insulating film having a thickness of 100 nm was formed with $SiO_2$ according to an RF magnetron sputtering vacuum deposition method (conditions of target: $SiO_2$, a film-forming temperature: 54° C., sputtering gas $Ar/O_2$=12/2 sc cm, RF power: 400 W, film-forming pressure: 0.4 Pa). In patterning of the gate insulating film $SiO_2$, a shadow mask was used at the time of sputtering.

The following active layer, intermediate layer, source electrode, drain electrode, and resistance layer were formed in order on the gate insulating film.

(1) Active Layer

An active layer was formed with polycrystalline sintered body having a composition of $InGaZnO_4$ as a target according to an RF magnetron sputtering vacuum deposition method on the conditions of an Ar flow rate of 97 sc cm, an $O_2$ flow rate of 1.6 sc cm, RF power of 200 W, and pressure of 0.4 Pa. The thickness was 50 nm.

(2) Intermediate Layer

An intermediate layer was formed with polycrystalline sintered body having a composition of $InGaZnO_4$ and $Ga_2O_3$ as targets respectively by RF magnetron sputtering vacuum deposition of binary co-deposition. A film was formed by adjusting the condition of each target to control each deposition rate so that the ratio of $InGaZnO_4$ and $Ga_2O_3$ becomes 85/15 in a volume ratio. The thickness was 10 nm.

The atomic ratio of In and Ga of the obtained intermediate layer was 20/30.

(3) Formation of Source Electrode and Drain Electrode

As a source electrode and a drain electrode, Al was sputtered in a thickness of 400 nm on the intermediate layer by RF magnetron sputtering (conditions of a film-forming temperature: 43° C., sputtering gas Ar=12 sc cm, RF power: 40 W, film-forming pressure: 0.4 Pa).

Resists were formed by a photolithographic method as follows, and etching treatment was performed.

<Formation of Resist>

Resists were coated by spin coating in a film thickness of 1 μm. The resist films formed were baked at 90° C.

<Etching Condition>

Etching was performed with a mixed solution of phosphoric acid and nitric acid at a liquid temperature of 35° C.

After completion of etching, the resists were dissolved with an alkali solution and removed to form a source electrode and a drain electrode.

(4) Resistance Layer

A resistance layer was formed in a thickness of 10 nm with $Ga_2O_3$ as a target according to an RF magnetron sputtering vacuum deposition method on the conditions of an Ar flow rate of 97 sc cm, an $O_2$ flow rate of 5 sc cm, and pressure of 0.4 Pa.

2) Manufacture of TFT devices 2 to 5 of the Invention

TFT devices 2 to 5 of the invention were manufactured in the same manner as in the manufacture of TFT device 1 except for changing the compositions of the intermediate layer and the resistance layer as follows.

<TFT Device 2>

Intermediate layer: Similarly to TFT device 1, a film was formed in a manner that the ratio of $InGaZnO_4$ and $Ga_2O_3$ becomes 85/15 in a volume ratio. The film thickness was 5 nm. Resistance layer: Similarly to TFT device 1, $Ga_2O_3$ was deposited in a thickness of 10 nm.

<TFT Device 3>

Intermediate layer: Similarly to TFT device 1, a film was formed in a manner that the ratio of $InGaZnO_4$ and $Ga_2O_3$ becomes 75/25 in a volume ratio. The film thickness was 10 nm. Resistance layer: Similarly to TFT device 1, $Ga_2O_3$ was deposited in a thickness of 10 nm.

<TFT Device 4>

Intermediate layer: Similarly to TFT device 1, a film was formed in a manner that the ratio of $InGaZnO_4$ and $Ga_2O_3$ becomes 85/15 in a volume ratio. The film thickness was 10 nm. Resistance layer: MgO was deposited in a thickness of 10 nm.

<TFT Device 5>

Intermediate layer: A film was formed in a manner that the ratio of $InGaZnO_4$ and MgO becomes 85/15 in a volume ratio. The film thickness was 10 nm. Resistance layer: MgO was deposited in a thickness of 10 nm.

3) Manufacture of Comparative TFT Devices 1 to 5

Comparative TFT devices 1 to 5 were manufactured in the same manner as in the manufacture of TFT device 1 except for omitting the intermediate layer and using the following composition as the resistance layer.

<Comparative TFT Device 1>

Resistance layer: Similarly to TFT device 1, $Ga_2O_3$ was deposited in a thickness of 10 nm.

<Comparative TFT Device 2>

Resistance layer: Similarly to TFT device 1, $Ga_2O_3$ was deposited in a thickness of 20 nm.

<Comparative TFT Device 3>

Resistance layer: Similarly to TFT device 1, $Ga_2O_3$ was deposited in a thickness of 10 nm. Further, the thickness of the active layer was changed to 60 nm.

<Comparative TFT Device 4>

Resistance layer: MgO was deposited in a thickness of 10 nm.

<Comparative TFT Device 5>

Resistance layer: Similarly to TFT device 1, $Ga_2O_3$ was deposited in a thickness of 10 nm. Further, the thickness of the active layer was changed to 5 nm.

2. Measurement of Physical Properties of Film

On the same manufacture condition as in the manufacture of the TFT device, samples for measuring physical properties were manufactured by directly providing these layers on a non-alkali glass substrate (product No. 1737, manufactured by Corning Inc.). Electric conductivity of each of these samples for measuring physical properties was measured.

—Measuring Method of Electric Conductivity—

The electric conductivity of each sample for measuring physical properties was found by computation from the measured sheet resistance and film thickness of the sample. Taking the sheet resistance as $\rho(\Omega/sq.)$, and the thickness as d (cm), electric conductivity $\sigma(Scm^{-1})$ is computed as $\sigma=1/(\rho*d)$.

In the invention, in the region of sheet resistance of the sample for measuring physical properties of less than $10^7\Omega/sq.$, Lorestar GP (manufactured by MITSUBISHI CHEMICAL ANALYTECH CO., LTD.) is used, and in the region of sheet resistance of $10^7$ $\Omega$/sq. or more, Hirester UP (manufactured by MITSUBISHI CHEMICAL ANALYTECH CO., LTD.) are used, and measurement is carried out in the environment of 20° C. In the measurement of the thickness of the sample for measuring physical properties, surface shape by a profilometer DekTak-6M (ULVAC Technologies Inc.) is used.

—Measuring Method of Composition Ratio—

A composition ratio of the sample for measuring physical properties is found according to RBS (Rutherford back scattering) analysis. A formed film is confirmed to be an amorphous film by known X-ray diffraction methods.

The results obtained are shown in Table 1 below.

3. Evaluation of Performances

1) Evaluation Methods

With respect to each obtained TFT device, TFT transfer characteristic was measured at saturation region drain voltage Vd=15V (gate voltage $-10V \leqq Vg \leqq 15V$). The measurement of TFT transfer characteristic was performed with a semiconductor parameter analyzer 4156C (manufactured by Agilent Technology).

Figure 7:
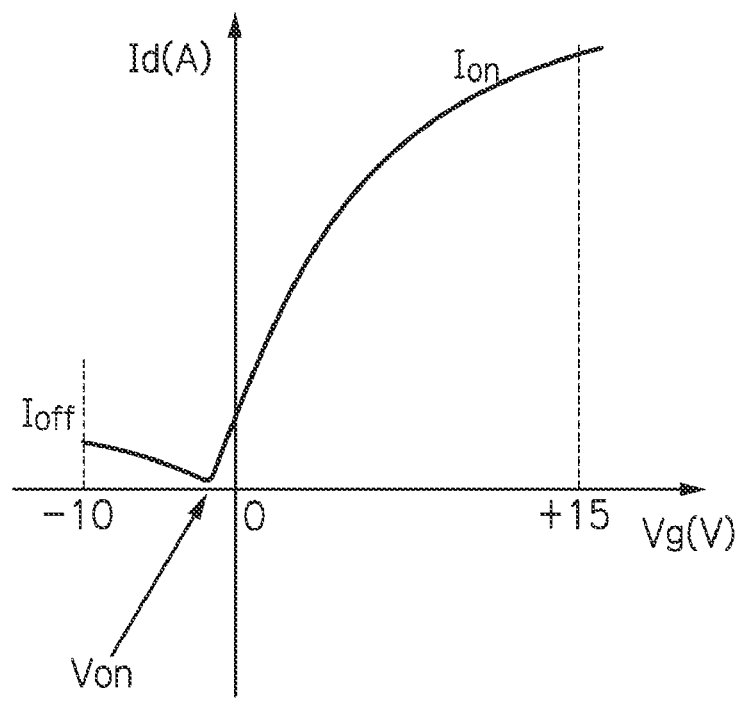
FIG. 7 is a pattern diagram of a transfer characteristic curve of TFT, which is an example in which ON/OFF ratio is clearly revealed, wherein the axis of abscissa expresses gate voltage (Vg) and the axis of ordinate expresses Isd (electric current between source/drain)

FIG. 7 is a electric current-voltage curve showing TFT transfer characteristic of these devices. The axis of abscissa expresses gate voltage (Vg) and the axis of ordinate expresses drain current (Id). There is voltage generating the minimum current value (Von) in the vicinity of gate voltage 0 V, which shows a pattern that the current value rises with the increase of the gate voltage. In the case of the pattern, a sufficient On/OFF ratio can be realized, and can be used as driving TFT of a display.

—Computing Method of ON/OFF Ratio—

On/OFF ratio can be found from TFT transfer characteristic, from the ratio of the maximum value $Id_{max}$ and the minimum value $Id_{min}$ in drain current Id, that is, $Id_{max}/Id_{min}$.

Figure 8:
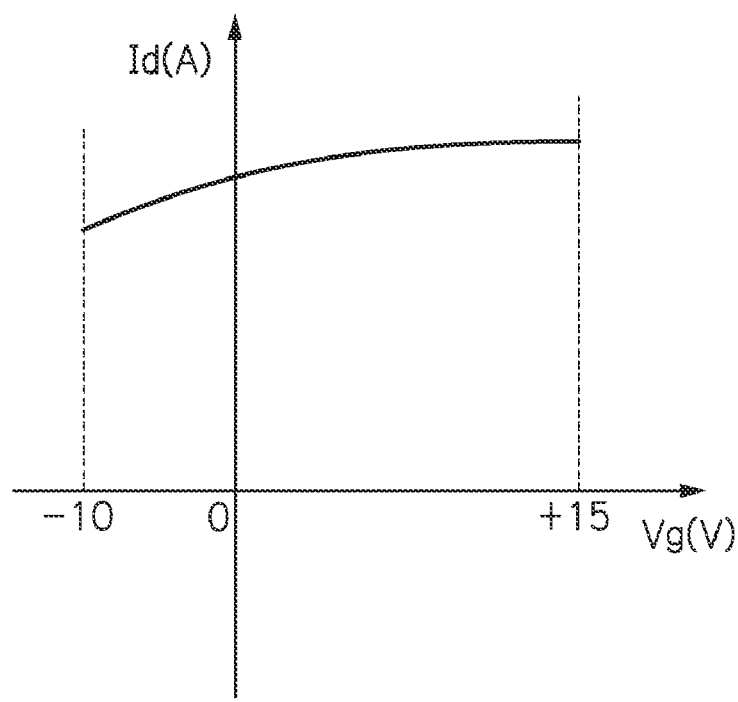
FIG. 8 is a pattern diagram of a transfer characteristic curve of TFT, which is an example in which ON/OFF ratio is indistinguishable.

On the other hand, FIG. 8 is an example of OFF current and ON current being indistinguishable within the scanning range of gate voltage, which cannot be used as driving TFT of a display. In the examples of this specification, the ON/OFF ratio of TFT that is evaluated as "does not operate" is as small as $<10^3$, which falls in this pattern.

—Computing Method of Field-Effect Mobility—

Field-effect mobility $\mu$ in a saturation region can be found by the following expression.

$$\mu=(2L/W^*C_{ox})^*(\theta Id^{1/2}/\theta Vg)$$

Here, L is a channel length, W is a channel width, $C_{ox}$ is electrostatic capacity of a gate insulating film, Id is a drain current, and Vg is a gate voltage.

TABLE 1

| TFT Device No. | Active Layer | | | Intermediate Layer | | | Resistance layer | | |
|---|---|---|---|---|---|---|---|---|---|
| | Material | Thickness (nm) | Electric Conductivity $(Scm^{-1})$ (a) | Material | Thickness (nm) | Electric Conductivity $(Scm^{-1})$ (a) | Material | Thickness (nm) | Electric Conductivity $(Scm^{-1})$ (c) |
| TFT 1 of the invention | IGZO | 50 | $1 \times 10^{-3}$ | IGZO/GO (85/15) | 10 | $5 \times 10^{-5}$ | GO | 10 | $1 \times 10^{-6}$ |
| TFT 2 of the invention | IGZO | 50 | $1 \times 10^{-3}$ | IGZO/GO (85/15) | 5 | $1 \times 10^{-5}$ | GO | 10 | $1 \times 10^{-6}$ |
| TFT 3 of the invention | IGZO | 50 | $1 \times 10^{-3}$ | IGZO/GO (75/25) | 10 | $3 \times 10^{-4}$ | GO | 10 | $1 \times 10^{-6}$ |
| TFT 4 of the invention | IGZO | 50 | $1 \times 10^{-3}$ | IGZO/GO (85/15) | 10 | $5 \times 10^{-5}$ | MgO | 10 | $3 \times 10^{-9}$ |
| TFT 5 of the invention | IGZO | 50 | $1 \times 10^{-3}$ | IGZO/MgO (85/15) | 10 | $1 \times 10^{-7}$ | MgO | 10 | $3 \times 10^{-9}$ |
| Comparative TFT 1 | IGZO | 50 | $1 \times 10^{-3}$ | — | — | — | GO | 10 | $1 \times 10^{-6}$ |
| Comparative TFT 2 | IGZO | 50 | $1 \times 10^{-3}$ | — | — | — | GO | 20 | $5 \times 10^{-7}$ |
| Comparative TFT 3 | IGZO | 60 | $1 \times 10^{-3}$ | — | — | — | GO | 10 | $1 \times 10^{-6}$ |
| Comparative TFT 4 | IGZO | 50 | $1 \times 10^{-3}$ | — | — | — | MgO | 10 | $3 \times 10^{-9}$ |
| Comparative TFT 5 | IGZO | 5 | $1 \times 10^{-2}$ | — | — | — | GO | 10 | $1 \times 10^{-6}$ |

IGZO: $InGaZnO_4$

GO: $Ga_2O_3$

The results obtained are shown in Table 2 below.
[Table 2]

TABLE 2

| TFT Device No. | Device Performance | | Remarks |
|---|---|---|---|
| | ON Voltage (Von) | ON/OFF Ratio | |
| TFT 1 of the invention | −0.6 | $2 \times 10^7$ | |
| TFT 2 of the invention | −5.4 | $5 \times 10^5$ | |
| TFT 3 of the invention | −2.4 | $7 \times 10^6$ | |
| TFT 4 of the invention | 0.6 | $2 \times 10^5$ | |
| TFT 5 of the invention | −3.4 | $3 \times 10^7$ | |
| Comparative TFT 1 | Does not operate. | — | |
| Comparative TFT 2 | Does not operate. | — | |
| Comparative TFT 3 | Does not operate. | — | |
| Comparative TFT 4 | Does not operate. | — | |
| Comparative TFT 5 | (+1.0) | $(2 \times 10^7)$ | Low in yield rate. |

Any of TFT devices 1 to 5 of the invention shows clearly distinguished ON voltage (Von), and a high ON/OFF ratio. On the other hand, comparative TFT devices 1 to 4 are all high in ON current, and they show TFT transfer characteristic incapable of achieving ON/OFF function.

Comparative TFT device 5 shows high ON/OFF ratio by a low ON current value according to measurement, but the yield rate is apparently low, and there are cases where the device does not operate at all. It is presumably due to the fact that the thickness of the active layer is as thin as 5 nm and, therefore, the active layer is influenced by the unevenness of the gate insulating film at the boundary with the gate insulating film, so that the active layer with a uniform thickness cannot be formed.

Further, in the constitution of the invention, the electric conductivity of the active layer is higher than that of the resistance layer by $10^1$ or more and excellent ON/OFF ratio is obtained.

As is apparent from the above, by the constitution of the invention comprising the oxide semiconductor layer as the active layer, the resistance layer higher in electric conductivity than the active layer, and the intermediate layer containing an oxide containing element species stronger in the bonding force to oxygen than the oxide semiconductor in the active layer provided between the active layer and the resistance layer, TFT devices of the invention show unexpectedly excellent performances such as high field-effect mobility and high ON/OFF ratio.

Example 2

1. Manufacture of TFT Device 6 of the Invention

TFT device 6 of the invention was manufactured in the same manner as in the manufacture of TFT device 1 of the invention except for using, as the substrate, a film with a barrier having an insulating layer having the following barrier function on both surfaces of a polyethylene naphthalate film, and changing the gate electrode formed on the barrier film from 30 nm of ITO to 40 nm of Mo. Film-forming conditions of Mo were the same as in Example 1.

SiON was used as the insulating layer having a barrier function. The film-forming conditions of the insulating layer SiON are as follows. Insulating layer: SiON is deposited in a thickness of 500 nm. An RF magnetron sputtering deposition method is used in deposition of SiON (conditions of sputtering: target, $Si_3N_4$, RF power: 400 W, flow rate of $Ar/O_2$=12/3 sc cm, film-forming pressure: 0.45 Pa).

2. Evaluation of Performances

As a result of evaluation of the performances of TFT device in the same manner as in Example 1, TFT device 6 of the invention shows the equivalent field-effect mobility and ON/OFF ratio as TFT device 1 of the invention manufactured on a glass plate. From this fact, it can be understood that TFT device in the invention shows high mobility and high ON/OFF ratio even manufactured on a flexible substrate of an organic plastic film.

The invention can provide TFT having high field-effect mobility and showing high ON/OFF ratio, and a display using the same. The invention can further provide TFT having stable performances. In particular, the invention can provide TFT useful as a film (flexible) TFT using a flexible substrate, and a display using the same.

What is claimed is:

1. A thin film field-effect transistor comprising a substrate having thereon at least a gate electrode, a gate insulating film, an active layer, a source electrode, and a drain electrode, wherein the active layer is an oxide semiconductor layer, a resistance layer having an electric conductivity that is lower than an electric conductivity of the active layer is provided between the active layer and at least one of the source electrode or the drain electrode, and an intermediate layer comprising an oxide comprising an element having a stronger bonding force with respect to oxygen than that of the oxide semiconductor in the active layer is provided between the active layer and the resistance layer.

2. The thin film field-effect transistor according to claim 1, wherein the oxide comprising an element having a strong bonding force with respect to oxygen contained in the intermediate layer is an oxide containing at least one element selected from the group consisting of Ba, Ca, Ti, Fe, Ga, Mg, Al, Ge and Si.

3. The thin film field-effect transistor according to claim 1, wherein the resistance layer is an oxide semiconductor layer.

4. The thin film field-effect transistor according to claim 1, wherein the electric conductivity of the active layer is $10^{-4}$ Scm$^{-1}$ or more and less than $10^2$ Scm$^{-1}$, and the ratio of the electric conductivity of the active layer to the electric conductivity of the resistance layer is from $10^1$ to $10^{10}$.

5. The thin film field-effect transistor according to claim 1, wherein the intermediate layer further contains an oxide semiconductor.

6. The thin film field-effect transistor according to claim 4, wherein the electric conductivity of the active layer is $10^{-1}$ Scm$^{-1}$ or more and less than $10^2$ Scm$^{-1}$.

7. The thin film field-effect transistor according to claim 4, wherein the ratio of the electric conductivity of the active layer to the electric conductivity of the resistance layer is from $10^2$ to $10^{10}$.

8. The thin film field-effect transistor according to claim 7, wherein the ratio of the electric conductivity of the active layer to the electric conductivity of the resistance layer is from $10^2$ to $10^8$.

9. The thin film field-effect transistor according to claim 1, wherein the oxide semiconductor of the active layer is an amorphous oxide.

10. The thin film field-effect transistor according to claim 3, wherein the oxide semiconductor of the resistance layer is an amorphous oxide.

11. The thin film field-effect transistor according to claim 5, wherein the oxide semiconductor of the intermediate layer is an amorphous oxide.

12. The thin film field-effect transistor according to claim 1, wherein the thickness of the active layer is thicker than the thickness of the resistance layer.

13. The thin film field-effect transistor according to claim 1, wherein the substrate is a flexible resin substrate.

14. A display using the thin film field-effect transistor according to claim 1.

* * * * *